(12) United States Patent
Sugawara et al.

(10) Patent No.: US 10,468,487 B2
(45) Date of Patent: Nov. 5, 2019

(54) SEMICONDUCTOR DEVICE

(71) Applicant: Mitsubishi Electric Corporation, Chiyoda-ku (JP)

(72) Inventors: Katsutoshi Sugawara, Tokyo (JP); Rina Tanaka, Tokyo (JP); Yutaka Fukui, Tokyo (JP); Kohei Adachi, Tokyo (JP); Kazuya Konishi, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/754,599

(22) PCT Filed: Jun. 27, 2016

(86) PCT No.: PCT/JP2016/069002
§ 371 (c)(1),
(2) Date: Feb. 23, 2018

(87) PCT Pub. No.: WO2017/064887
PCT Pub. Date: Apr. 20, 2017

(65) Prior Publication Data
US 2018/0248008 A1    Aug. 30, 2018

(30) Foreign Application Priority Data

Oct. 16, 2015  (JP) .............................. 2015-204247

(51) Int. Cl.
*H01L 29/16* (2006.01)
*H01L 29/49* (2006.01)
(Continued)

(52) U.S. Cl.
CPC .... *H01L 29/1608* (2013.01); *H01L 29/41725* (2013.01); *H01L 29/42316* (2013.01); *H01L 29/49* (2013.01); *H01L 29/78* (2013.01)

(58) Field of Classification Search
CPC ..................................................... H01L 29/046
See application file for complete search history.

(56) References Cited

U.S. PATENT DOCUMENTS

2003/0040144 A1* 2/2003 Blanchard ........... H01L 29/7813
                                                              438/145
2008/0197361 A1   8/2008  Ueno
(Continued)

FOREIGN PATENT DOCUMENTS

JP       4-162573 A    6/1992
JP       05-7002 A    1/1993
(Continued)

OTHER PUBLICATIONS

International Preliminary Report on Patentability and Written Opinion dated Apr. 26, 2018 in PCT/JP2016/069002.

(Continued)

*Primary Examiner* — Wael M Fahmy
*Assistant Examiner* — Sarah K Salerno
(74) *Attorney, Agent, or Firm* — Oblon, McClelland, Maier & Neustadt, L.L.P.

(57) ABSTRACT

A semiconductor device in which an interlayer insulation film covers striped gate electrodes with a thickness larger than a thickness of a gate oxide film. The interlayer insulation film includes first contact holes outside each striped trench, and second contact holes inside the striped trench. In a plan view, striped active regions and striped contact regions both extending in a longitudinal direction exist. The striped active regions and the striped contact regions are alternately and repeatedly disposed in a direction perpendicular to the longitudinal direction. In each of the striped active regions, the source electrode is connected to a source region through the first contact hole. In each of the striped (Continued)

contact regions, the source electrode is connected to a protective diffusion layer through the second contact hole.

16 Claims, 16 Drawing Sheets

(51) Int. Cl.
    *H01L 29/78* (2006.01)
    *H01L 29/417* (2006.01)
    *H01L 29/423* (2006.01)

(56) References Cited

U.S. PATENT DOCUMENTS

| | | |
|---|---|---|
| 2010/0224932 A1 | 9/2010 | Takaya et al. |
| 2012/0199899 A1 | 8/2012 | Kobayashi et al. |
| 2013/0285140 A1 | 10/2013 | Kagawa et al. |
| 2014/0042523 A1 | 2/2014 | Yamagami et al. |
| 2015/0214355 A1* | 7/2015 | Nakano ............ H01L 29/41766 257/330 |

FOREIGN PATENT DOCUMENTS

| | | |
|---|---|---|
| JP | 2001-511315 A | 8/2001 |
| JP | 2003-520430 A | 7/2003 |
| JP | 2007-242852 A | 9/2007 |
| JP | 2008-186925 A | 8/2008 |
| JP | 2012-164916 A | 8/2012 |
| JP | 2014-127547 A | 7/2014 |
| WO | 98/35390 A1 | 8/1998 |
| WO | 01/52306 A2 | 7/2001 |
| WO | 2012/077617 A1 | 6/2012 |
| WO | 2012/144271 A1 | 10/2012 |

OTHER PUBLICATIONS

Office Action dated Nov. 15, 2017 in corresponding Japanese Application No. 2016-560021 (with English translation).
International Search Report dated Aug. 23, 2016 in PCT/JP2016/069002, filed on Jun. 27, 2016.

* cited by examiner

F I G. 1 1
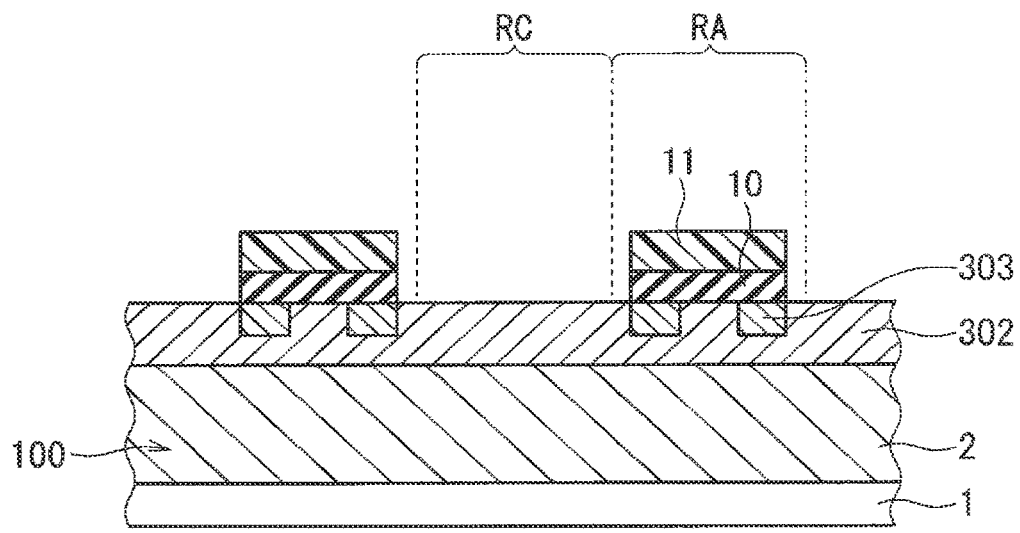
F I G. 1 2
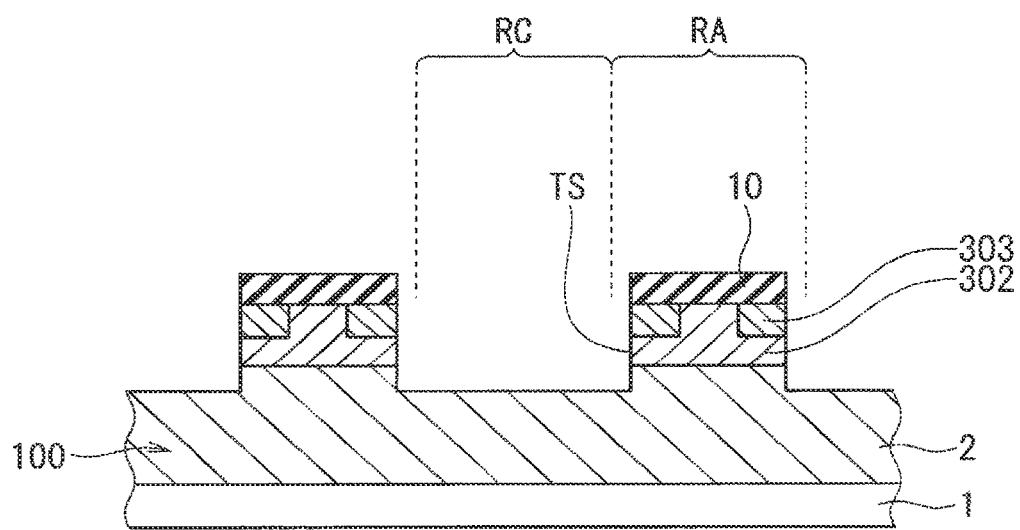

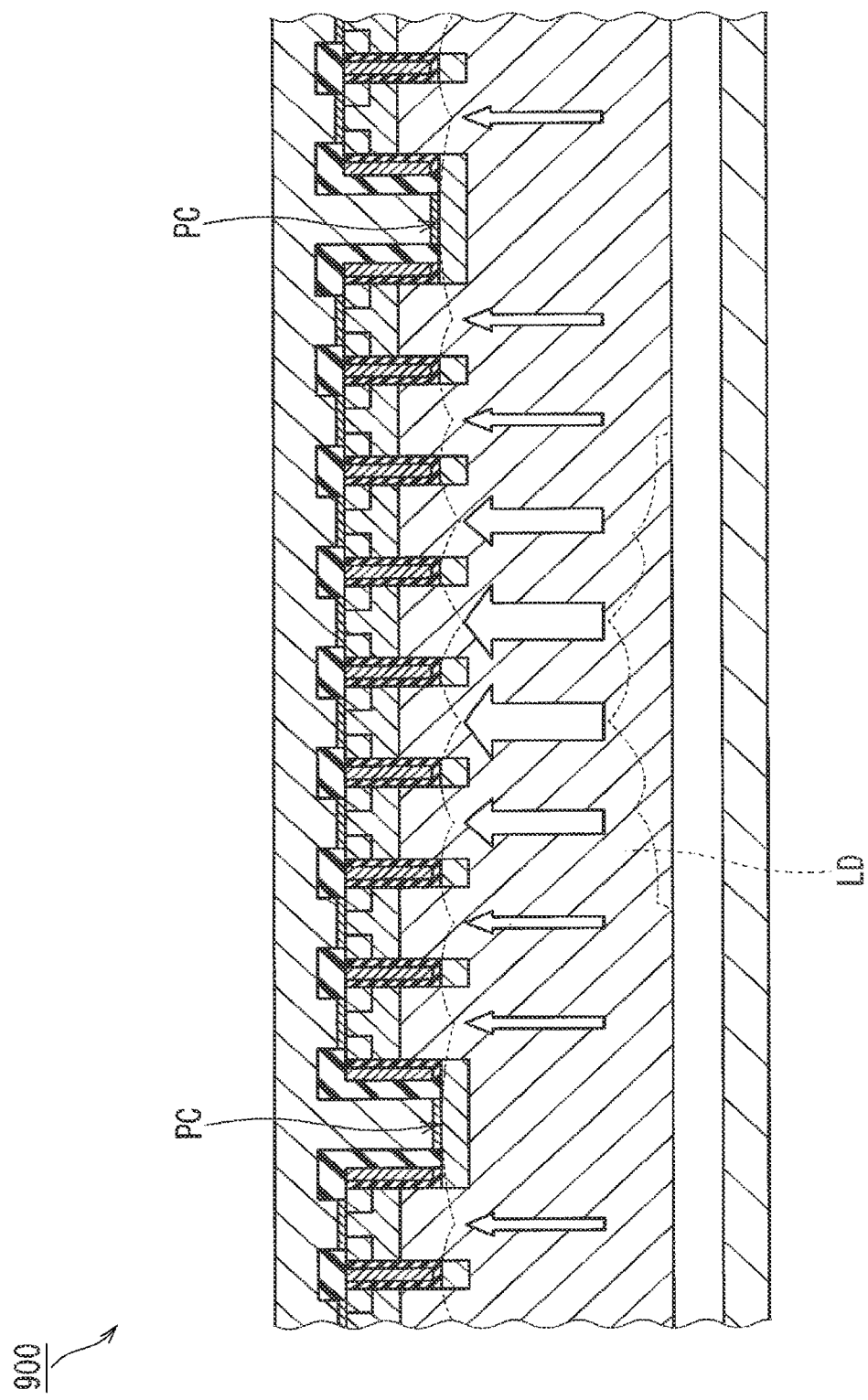
F I G. 25

SEMICONDUCTOR DEVICE

TECHNICAL FIELD

The present invention relates to a semiconductor device, and particularly to a trench-gate power semiconductor device.

BACKGROUND ART

Insulated gate semiconductor devices such as an insulated gate bipolar transistor (IGBT) and a metal oxide semiconductor field effect transistor (MOSFET) have been widely used in power electronics equipment as switching elements for controlling the power supplied to loads such as a motor. Power loss in the switching elements is preferably less in view of energy saving. Indicators representing g this loss include ON resistance. The ON resistance represents a drain-source electrical resistance when the MOSFET is turned ON. The switching elements suitable for reducing the ON resistance include trench-gate MOSFETs each with a gate electrode embedded in a semiconductor layer. The trench-gate MOSFETs can have channel width densities higher than those of normal planar MOSFETs. Thus, the ON resistance per unit area can be reduced.

Further attention is being given to wide-bandgap semiconductors such as silicon carbide (SiC) as semiconductor materials for the next-generation switching elements. Particularly, its application to a technical field that deals with voltages as high as or higher than 1 kV is viewed as promising. Examples of the wide-bandgap semiconductors include a gallium nitride (GaN) based material and diamond as well as the SiC.

The switching elements are used in, for example, inverter circuits. In order to miniaturize such circuits, increasing the working frequency, that is, accelerating the switching elements is a must. Operation speed of SiC-MOSFETs can be several times higher than that of SiC-IGBTs that have been conventionally widely used. Thus, the wide-bandgap semiconductors are viewed as promising also from this viewpoint. When a semiconductor material having a hexagonal crystal structure, for example, SiC is applied to the trench-gate MOSFETs, a direction of the current path preferably coincides with an a-axis direction with higher carrier mobility. This will expectedly bring a substantial decrease in the ON resistance.

However, the trench-gate MOSFETs for controlling power have a problem with a gate oxide film susceptible to breakage due to the electric field concentration at the bottom of trenches. When the gate oxide film breaks down, the element fails to function as an MOSFET. Thus, techniques for avoiding the electric field concentration at the bottom of trenches in a trench-gate MOSFET have been studied. Particularly, a technique for forming, at the bottom of a trench, a protective diffusion layer with a conductivity type opposite to that of a substrate is well-known. This technique is effective at relaxing the electric field concentration but is insufficient from the viewpoint of its switching. This will be described below.

When high voltages are shut off through switching an MOSFET from an ON state to an OFF state, a depletion layer extending between the protective diffusion layer and the substrate blocks the current path. Conversely, in switching the MOSFET from the OFF state to the ON state, a current path is opened by shrinking the depletion layer. The response speed of the depletion layer in this switching is controlled by the lifetime of minority carriers. Since this time is longer than the switching time, simply disposing the protective diffusion layer does not allow for sufficiently high switching speed.

Patent Document 1 describes electrically connecting a protective diffusion layer to a source electrode by connecting the protective diffusion layer to a base region along trenches to increase the switching speed. Here, the response speed of a depletion layer is determined not by the lifetime of minority carriers but by the time until the minority carriers e extracted by the source electrode. Since this time is shorter than the lifetime of the minority carriers, the technique according to Patent Document 1 produces an advantage of increasing the switching speed. However, the time to extract the minority carriers depends on electrical resistance from the protective diffusion layer to the source electrode. Since a current path particularly from the protective diffusion layer to the base region is narrow under this technique, the resistance increases. Thus, increase in the switching speed may be insufficient under this technique.

Patent Document 2 describes thinning out a part of cells included in an MOSFET and connecting a protective diffusion layer to a source electrode through the thinned-out part. Since a current path from the protective diffusion layer to the source electrode is wider under this technique, this technique produces an advantage higher than that of Patent Document 1.

Patent Document 3 describes a technique aiming at highly integrating semiconductor devices each with both a transistor and a diode. In one example of this technique, contact holes are formed in and along striped trenches each with a gate electrode. Consequently, air anode region of a diode is connected to a source electrode of an MOSFET.

PRIOR ART DOCUMENTS

Patent Documents

Patent Document 1: Japanese Patent Application Laid-Open No. 2007-242852
Patent Document 2: WO2012/077617
Patent Document 3: WO2012/144271

SUMMARY

Problem to be Solved by the Invention

As described above, Patent Document 2 describes a technique for forming a region for grounding the protective diffusion layer on the source electrode (hereinafter also referred to as a "protective-diffusion-layer grounding region") by eliminating a cell functioning as an MOSFET. However, a depletion layer LD in an MOSFET 900 (see FIG. 25) with such a structure has a faster response speed in a portion closer to a protective-diffusion-layer grounding region PC but a slower response speed in a portion distant from the protective-diffusion-layer grounding region PC. This difference causes a current to crowd toward the portion distant from the protective-diffusion-layer grounding region PC in switching from ON to OFF. Heat or high-energy carriers generated at that time may have an influence on breaking down a gate insulating film. Particularly, since an MOSFET made of SiC has a lower ON resistance and a higher current to be generated than those of a Si power device with an equivalent breakdown voltage, the heat to be generated is also increased. Thus, the gate insulating film is susceptible to breakage caused by such a phenomenon.

In contrast, Patent Document 3 describes a structure for connecting the anode region to the source electrode by forming striped contact holes in trenches formed in stripes. However, the technique of Patent Document 3 aims at highly integrating semiconductor devices with both a transistor and a diode. Under the technique of Patent Document 3, a protective diffusion layer is connected to the source electrode through forming a contact hole not in a cell functioning as an MOSFET but in a gate trench unlike the technique of Patent Document 2. In the gate trench, an inner wall insulating film separating the gate electrode from the source electrode is formed thinner than an interlayer insulation film. Thus, the gate-source capacitance increases. Consequently, the advantage of increasing the switching speed is not sufficiently produced.

As described above, reduction in breakage of the gate insulating film and increase in the switching speed have hardly become compatible according to the conventional techniques.

The present invention has been conceived to solve such problems, and has an object of providing a semiconductor device that can both reduce breakage of the gate insulating film and increase the switching speed.

Means to Solve the Problem

A semiconductor device according to the present invention dudes a drift layer, a base region, a source region, a plurality of striped trenches, a protective fusion layer, a gate insulating film, striped gate electrodes, an interlayer insulation film, and a source electrode. The drift layer is of a first conductivity type. The base region of a second conductivity type and formed on the drift layer. The source region is of the first conductivity type, and is formed on the base region and separated from the drift layer by the base region. A plurality of striped trenches each have, in a cross-sectional view, a pair of sidewalls penetrating the source region and the base region to reach the drift layer, and extend in stripes in a plan view. The protective diffusion layer is of the second conductivity type, and is in contact with the drift layer and formed at a bottom of each of the striped trenches. The gate insulating film is formed adjacent to the pairs of the sidewalls of the striped trenches to cover the base region and the source region. The striped gate electrodes each have a first side surface, a second side surface, and an upper surface in each of the striped trenches, the first side surface being adjacent to the base region through the gate insulating film, the second side surface being opposite to the first side surface, and the upper surface connecting the first side surface to the second side surface. The interlayer insulation film covers the second side surfaces and the upper surfaces of the striped gate electrodes with a thickness larger than a thickness of the gate oxide film, and includes first contact holes connected to the source region and the base region outside each of the striped trenches, and second contact holes connected to the protective diffusion layer inside the striped trenches. The source electrode is connected to the source region, the base region, and the protective diffusion layer.

In the plan view, a plurality of striped active regions and a plurality of striped contact regions both extending in a longitudinal direction exist in the semiconductor device. A striped pattern is provided with the semiconductor device by alternately and repeatedly disposing the striped active regions and the striped contact regions in a direction perpendicular to the longitudinal direction. The striped active regions and the striped contact regions are partitioned by the striped gate electrodes. The source electrode is connected to the source region and the base region through the first contact holes of the interlayer insulation film in each of the striped active regions. Each of the striped gate electrodes forms a switchable channel with the first side surface being adjacent to the base region through the gate insulating film in a corresponding one of the striped trenches. The source electrode is connected to the protective diffusion layer through the second contact holes of the interlayer insulation film in each of the striped contact regions.

Effects of the Invention

According to the present invention, the striped active regions through which a main current conducts and the striped contact regions which have the protective-diffusion-layer grounding regions are alternately disposed; thereby, variations in distance from the protective-diffusion-layer grounding region to the protective diffusion layer at the bottom of each of the trenches are reduced. Thus, the breakage of the gate insulating film caused by current crowding in a transient response can be reduced. Further, according to the present invention, the second side surface of the striped gate electrode is covered with a thickness larger than that of the gate insulating film. Consequently, the capacitance between the source electrode and the second side surface of the striped gate electrode facing the source electrode is reduced. Thus, the switching speed can be increased.

The object, features, aspects, and advantages of the present invention will become more apparent from the following detailed description and the accompanying drawings.

BRIEF DESCRIPTION OF DRAWINGS

FIG. 11 is a partial sectional view schematically illustrating a process of the method for manufacturing the semiconductor device of FIG. 1.

FIG. 12 is a partial sectional view schematically illustrating a process of the method for manufacturing the semiconductor device of FIG. 1.

FIG. 25 is a schematic view illustrating spreading of a depletion layer and a current flow in switching of a semiconductor device of a comparative example.

DESCRIPTION OF EMBODIMENTS

Embodiments of a semiconductor device according to the present invention will be hereafter described in detail based on the drawings. The present invention is not limited by the following description but can be appropriately modified without departing from the gist of the present invention. To facilitate the understanding, the scale of each component in the following drawings may differ from the actual scale. This holds true between the drawings.

Embodiment 1

Figure 1:
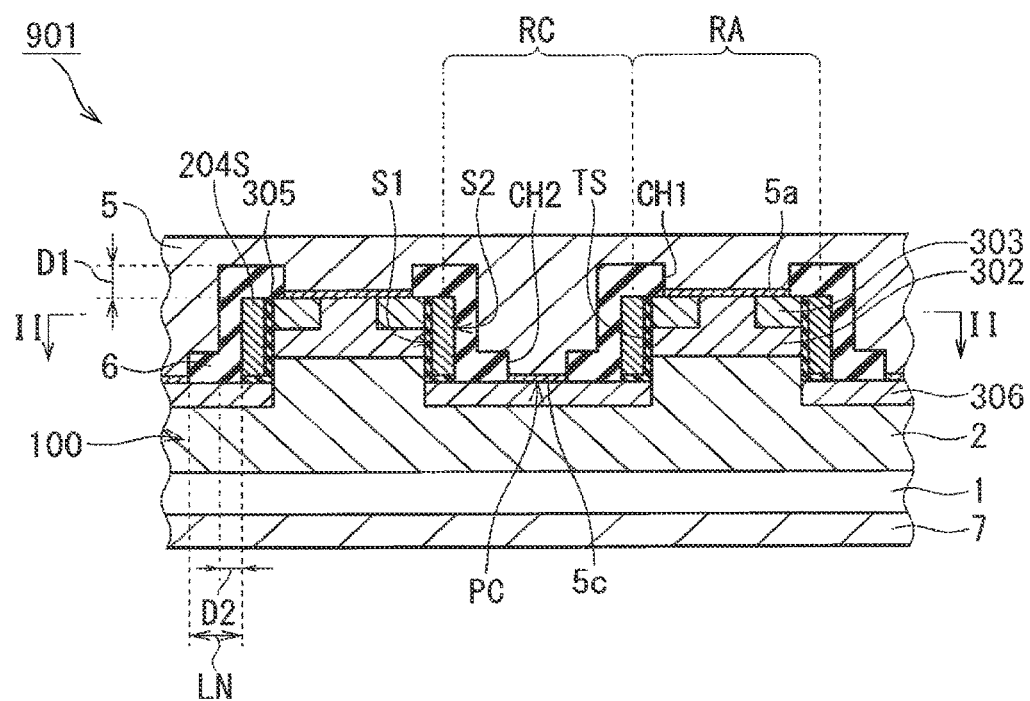
FIG. 1 is a partial sectional view taken along the line I-I of FIG. 2 and schematically illustrating a structure of a semiconductor device according to Embodiment 1 of the present invention with a field of view along a thickness direction.
Figure 2:
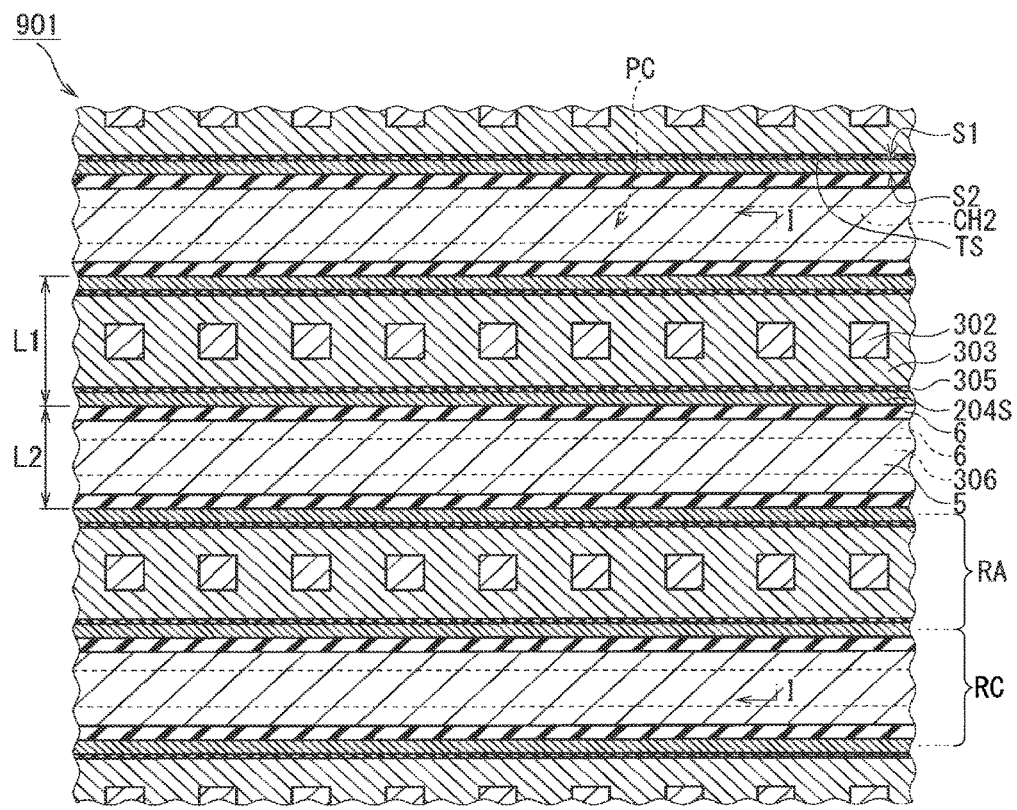
FIG. 2 is a partial sectional view taken along the line II-II of FIG. 1 and schematically illustrating the structure of the semiconductor device according to Embodiment 1 of the present invention with a field of view corresponding to a plan view.

FIGS. 1 and 2 each is a partial sectional view schematically illustrating a structure of an MOSFET 901 (a semiconductor device) according to Embodiment 1. The field of view of FIG. 1 is shown along the line I-I of FIG. 2, and the field of view of FIG. 2 is shown along the line II-II of FIG. 1.

The MOSFET 901 includes, in a plan view (a field of view corresponding to FIG. 2, i.e., a field of view corresponding to a plane perpendicular to a thickness direction), a plurality of striped active regions RA extending in a longitudinal direction (a horizontal direction in FIG. 2) and a plurality of striped contact regions RC extending in the same longitudinal direction. A striped pattern provided with the MOSFET 901 by alternately and repeatedly disposing the striped active regions RA and the striped contact regions RC in a direction perpendicular to the longitudinal direction (a vertical direction in FIG. 2). The striped active regions RA are regions actually functioning as MOSFET elements. The striped contact regions RC are regions each including a protective-diffusion-layer grounding region PC, that is, a region for grounding a protective diffusion layer 306 on a source electrode 5. The striped active regions RA and the striped contact regions RC are partitioned by striped gate electrodes 204S (to be described later in detail).

The MOSFET 901 includes a substrate 1, an epitaxial layer 100 (a semiconductor layer), a gate oxide film 305 (a gate insulating film), the striped gate electrodes 204S, an interlayer oxide film 6 (an interlayer insulation film), the source electrode 5, and a drain electrode 7.

The substrate 1 is made of a semiconductor, preferably made of a wide-bandgap semiconductor, and made of SiC in Embodiment 1. The substrate 1 is of n-type (a first conductivity type). The epitaxial layer 100 is obtained by epitaxial growth on the substrate 1. Each of the substrate 1 and the epitaxial layer 100 is disposed over both the striped active regions RA and the striped contact regions RC.

The epitaxial layer 100 includes a drift layer 2, base regions 302, source regions 303, and protective diffusion layers 306. The epitaxial layer 100 also includes a plurality of striped trenches TS.

The drift layer 2 is of n-type. The drift layer 2 is preferably lower in impurity concentration than the substrate 1. The base regions 302 are formed on the drift layer 2 in the striped active regions RA. The base regions 302 are formed as a part of a surface (an upper surface in FIG. 1) of the epitaxial layer 100. The base regions 302 are of p-type (a second conductivity type). The source regions 303 are formed on the base regions 302, and separated from the drift layer 2 by the base regions 302. The source regions 303 are adjacent to the striped gate electrodes 204S through the gate oxide film 305. The source regions 303 are of n-type.

The epitaxial layer 100 is made of SiC in Embodiment 1. Thus, the drift layer 2 is made of SiC. The substrate 1 and the epitaxial layer 100 form a SiC substrate as an epitaxial substrate. The SiC substrates that are widely used have, as a substrate surface, a surface having 4° of an off-angle with respect to a (0001) plane that is a c-plane of SiC crystals. This is because crystals with a desired crystal structure can be grown for SiC crystals, which have a polytype structure. When an off-direction, which is a direction given the off-angle on the substrate surface, is parallel to the longitudinal direction of the striped active regions RA and the striped contact regions RC, no atomic layer step is generated in an interface between the gate oxide film 305 and the epitaxial layer 100 made of SiC. When the off-direction is perpendicular to the longitudinal direction, atomic layer steps are generated in the interface. The existence of the atomic layer steps influences the magnitude of the interface state density.

The gate breakdown voltage obtained when the off-direction is parallel to the longitudinal direction is higher under this influence.

Each of the striped trenches TS has, in a cross-sectional view, a pair of sidewalls (sidewalls extending in the vertical direction of FIG. 1) that penetrates the source region 303 and the base region 302 to reach the drift layer 2. The plurality of striped trenches TS extend in stripes in a plan view (the field of view corresponding to FIG. 2).

The protective diffusion layers 306 are in contact with the drift layer 2, and formed at the bottom of the striped trenches TS. The protective diffusion layers 306 are of p-type. The protective diffusion layers 306 are facing the bottom of the striped gate electrodes 204S through the gate oxide film 305. Thus, when the MOSFET 901 is turned OFF, the protective diffusion layers 306 promote the depletion of the drift layer 2 and relaxes the electric field concentration at the bottom of the striped trenches TS to prevent breakage of the gate oxide film 305. The protective diffusion layers 306 are formed over the entirety of the striped contact regions RC in a plan view. The protective diffusion layers 306 are preferably higher in p-type impurity concentration than the base regions 302.

The gate oxide film 305 is adjacent to the respective pairs of the sidewalls of the striped trenches TS to cover the base regions 302 and the source regions 303. The bottom of the striped trenches TS has portions which are facing the striped gate electrodes 204S; the gate oxide film 305 covers the portions. The thickness of the portion of the gate oxide film 305 facing the bottom of the striped gate electrode 204S (the dimension in the vertical direction of FIG. 1) may be as same as but is preferably larger than that of the portion of the gate oxide film 305 facing a first side surface S1 of the striped gate electrode 204S (the dimension in the horizontal direction of FIG. 1). Since the portions of the gate oxide film 305 facing the bottom of the striped gate electrodes 204S do not contribute to operations as the MOSFET elements, change in the thickness does not influence a threshold of the MOSFET 901. In view of the gate insulating film susceptible to breakage due to the electric field concentration at the bottom of trenches as described above, the thickness of the portion of the gate oxide film 305 facing the bottom of the striped gate electrode 204S is preferably larger than that of the portion of the gate oxide film 305 facing the first side surface S1 of the striped gate electrode 204S. Consequently, the electric field to be applied to the gate oxide film 305 can be relaxed without influencing the threshold.

The striped gate electrodes 204S are formed in the striped trenches TS of the epitaxial layer 100 as gate electrodes of the MOSFET 901. The striped gate electrodes 204S are insulated from the epitaxial layer 100 by the gate oxide film 305. The striped gate electrodes 204S are disposed between the striped active regions RA and the striped contact regions RC. In other words, the striped gate electrodes 204S are boundaries between the striped active regions RA and the striped contact regions RC. The striped gate electrodes 204S are disposed in stripes in a plan view (the field of view corresponding to FIG. 2). The striped gate electrodes 204S each have the first side surface S1, a second side surface S2 opposite to the first side surface S1, and upper and lower surfaces connecting the first side surface S1 to the second side surface S2. The first side surface S1 is adjacent to the base region 302 through the gate oxide film 305 in the striped trench TS. Thus, each of the striped gate electrodes 204S forms a switchable channel.

The interlayer oxide film 6 includes first contact holes CH1 and second contact holes CH2. The first contact hole CH1 is connected to the source region 303 and the base region 302 in the striped active region RA outside the striped trench TS. The second contact hole CH2 is connected to the protective diffusion layer 306 in the striped trench TS in the striped contact region RC.

The interlayer oxide film 6 covers the supper surface of each of the striped gate electrodes 204S with a thickness D1. The interlayer oxide film 6 covers the second side surface S2 of each of the striped gate electrodes 204S with a thickness D2. Each of the thicknesses D1 and D2 is larger than the thickness of the gate oxide film 305 (a thickness of the portion covering the first side surface S1). The thicknesses D1 and D2 may be mutually identical or different. Preferably, the thickness D2 needs to be identical to the thickness D1, or smaller than but almost as large as the thickness D1 (for example, has a thickness approximately 80% of the thickness D1 or larger). This is because if the thickness D2 is too small, increase in the gate-source capacitance causes decrease in the switching speed. To prevent a reaction between the striped gate electrode 204S and a metal film to be used in a process of forming an ohmic electrode portion 5c to be described later, it is preferred to sufficiently increase a length LN of the interlayer oxide film 6 between the side surface of the second contact hole CH2 and the second side surface S2 of the striped gate electrode 204S. Considering these dimensions, a distance L1 (FIG. 2) ranges from 3.0 μm to 9.0 μm, and a distance L2 (FIG. 2) ranges from 3.0 μm to 6.0 μm. Here, the distance L1 is a distance between the adjacent second side surfaces S2 that sandwich the striped active region RA. Furthermore, the distance L2 is a distance between the adjacent second side surfaces S2 that sandwich the striped contact region RC.

The source electrode 5 is formed on the interlayer oxide film 6 including the first contact holes CH1 and the second contact holes CH2. The source electrode 5 includes ohmic electrode portions 5a and 5c to be electrically connected to the epitaxial layer 100 with low resistance. In each of the striped active regions RA, the source electrode 5 is connected to the source regions 303 and the base region 302 through the first contact hole CH1 of the interlayer oxide film 6. The source electrode 5 includes the ohmic electrode portions 5a as portions connected to the source regions 303 and the base regions 302. In each of the striped contact regions RC, the source electrode 5 is connected to the protective diffusion layer 306 through the second contact hole CH2 of the interlayer oxide film 6. The source electrode 5 includes the ohmic electrode portions 5c as portions connected to the protective diffusion layers 306. With this structure, the protective-diffusion-layer grounding regions PC (FIG. 1), which are connected regions between the source electrode 5 and the protective diffusion layers 306, exist linearly (in stripes) in the MOSFET 901 in a plan view (the field of view corresponding to FIG. 2).

The drain electrode 7 is formed on the lower surface of the substrate 1 (a surface opposite to the surface on which the epitaxial layer 100 is formed).

The MOSFET 901 may further include a gate leading electrode and a gate pad (not illustrated). The gate leading electrode is an electrode functioning as a line that leads a gate electrode to the gate pad (not illustrated). The gate pad is an electrode that receives a gate voltage applied from outside.

Figure 3:
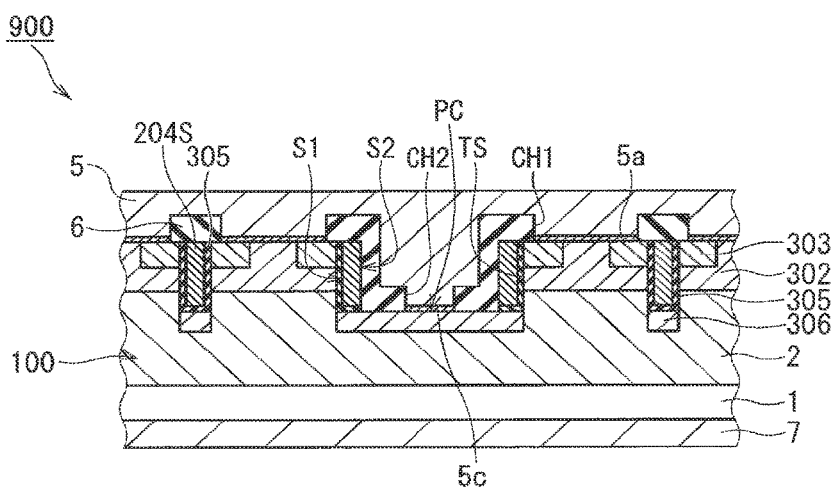
FIG. 3 is a partial sectional view illustrating a structure of a semiconductor device of a comparative example.

Next, an MOSFET 900 (FIG. 3) of a comparative example will be described. Unlike Embodiment 1, a plurality of protective-diffusion-layer grounding regions PC are disposed in the MOSFET 900 not in stripes but interspersedly (not illustrated). Any layout of the MOSFET 900 includes interspersed portions that are the most distant from the protective-diffusion-layer grounding regions PC. In a transient response from ON to OFF of the MOSFET 900, a drain-source current flowing uniformly until then becomes crowded at the interspersed portions. Consequently, the MOSFET 900 is susceptible to breakage.

In the MOSFET 901 according to Embodiment 1, the protective-diffusion-layer grounding regions PC are disposed not interspersedly but in stripes as illustrated in FIG. 2. The portions that are the most distant from the protective-diffusion-layer grounding regions PC are not interspersed but linearly located each between the two adjacent linear protective-diffusion-layer grounding regions PC. Thus, between the two adjacent linear protective-diffusion-layer grounding regions PC, almost the same response of the extension of a depletion layer from a p-n junction between the protective diffusion layer 306 and the drift layer 2 is obtained. In a transient response from ON to OFF of the MOSFET 901, a current does not interspersedly crowd as described above. Thus, the breakage of the gate oxide film 305 caused by the current crowding can be prevented.

When the protective-diffusion-layer grounding regions PC are formed not interspersedly but linearly as according to Embodiment 1, the channel width density is somewhat sacrificed. Decrease in the channel width density increases the ON resistance.

One of the methods for reducing the amount of increase in the ON resistance is a method for narrowing the width of the striped contact region RC. The width of the striped contact region RC may be narrower than that of the striped active region RA. Consequently, the area occupied by the striped contact regions RC may be substantially smaller than that occupied by the striped active regions RA in a plan view. With such an intension, it is probable to apply a method for maintaining electrical insulation between the striped gate electrodes 204S and the source electrode 5 using a relatively thin insulating film formed by, for example, oxidizing sidewalls of the striped gate electrodes 204S. Consequently, the width of the striped contact regions RC can be reduced. In such a case, however, the gate-source capacitance increases, and the switching speed correspondingly decreases. Thus, a porous material, which is a material with a lower dielectric constant, may be used as a material of the interlayer oxide film 6 with the aim of maintaining a higher switching speed through reducing the gate-source capacitance while narrowing the width of the striped contact regions RC. For example, a porous silicon oxide film may be used.

There is a method for applying a sufficiently large gate field instead of or in combination with the above methods. The present inventors consider that a proportion of the channel resistance in the ON resistance is sufficiently reduced with application of a sufficiently large gate field. With such application, the increase in the ON resistance described above will be negligible compared to the total ON resistance.

Figure 4:
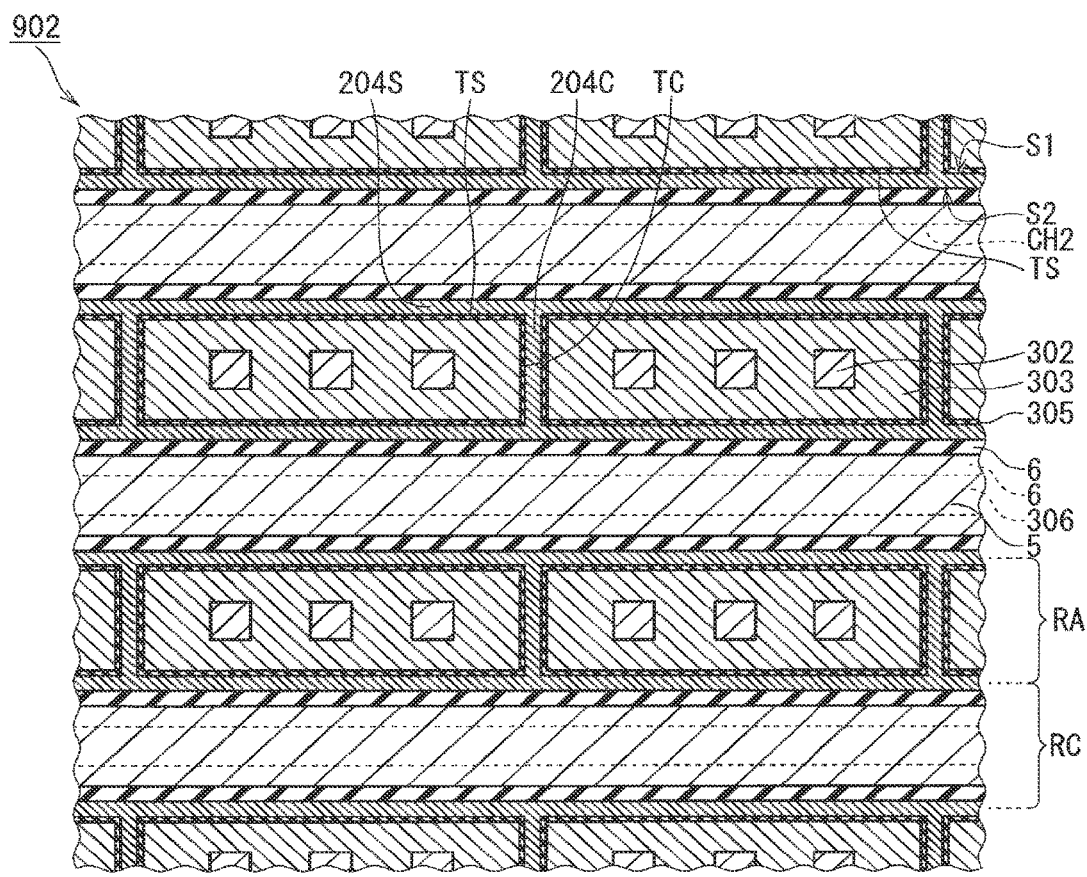
FIG. 4 is a partial sectional view schematically illustrating a modified structure of the semiconductor device of FIG. 2.

Next, an MOSFET 902 (a semiconductor device) of a modification will be described with reference to FIG. 4. The MOSFET 902 includes intersecting trenches TC and intersecting gate electrodes 204C. The intersecting trenches TC are formed in the epitaxial layer 100 (FIG. 1). In a cross-sectional view (a field of view perpendicular to FIG. 4), each of the intersecting trenches TC includes a pair of sidewalls (left and right surfaces in FIG. 4). These sidewalls penetrate the source regions 303 and the base regions 302 to reach the drift layer 2. The intersecting trenches TC extend, in the striped active regions RA, in a direction transverse to the longitudinal direction (a horizontal direction in FIG. 4), specifically, in a direction orthogonal to the longitudinal direction. The intersecting gate electrode 204C forms a gate electrode of the MOSFET 902 with the striped gate electrode 204S. The intersecting gate electrodes 204C are formed in the intersecting trenches TC through the gate oxide film 305. The intersecting gate electrode 204C mutually connects, in a direction perpendicular to the longitudinal direction, two adjacent portions of the striped gate electrodes 204S that sandwich one of the striped active regions RA. With such a structure, the striped active regions RA have shapes of rectangles (including a square) as illustrated in FIG. 4.

The channel width density in the presence of the intersecting gate electrodes 204C can be increased more than that in the absence of the intersecting gate electrodes 204C. Thus, the ON resistance per unit area can be reduced. This modification is particularly effective when the gate field hardly increases, for example, when the gate oxide film 305 is thicker or when a voltage of a gate driver to be connected to the MOSFET 901 cannot be increased.

Figure 5:
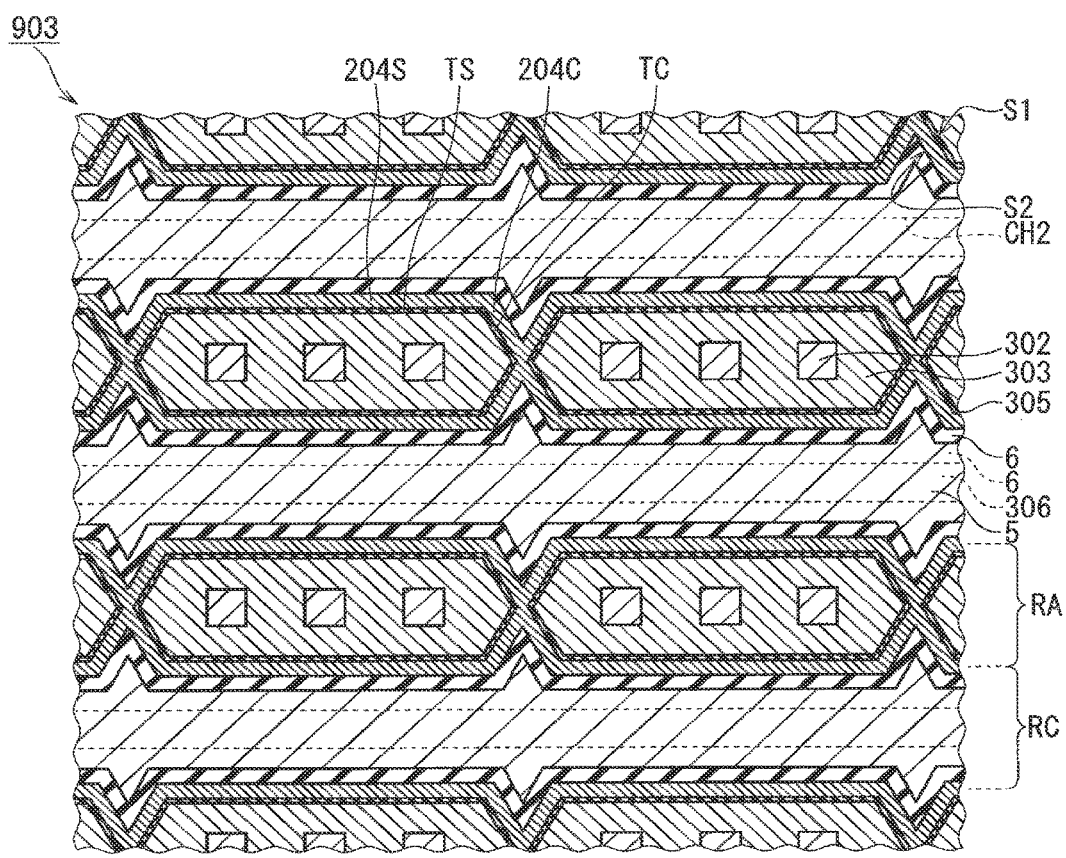
FIG. 5 is a partial sectional view schematically illustrating a modified structure of the semiconductor device of FIG. 2.

With reference to FIG. 5 illustrating an MOSFET 903 (a semiconductor device) of another modification, the striped active regions RA include hexagonal shapes, specifically, shapes each obtained by extending a hexagon in one direction along one of the sides. When the epitaxial layer 100 has a hexagonal crystal structure, sidewalls of the striped trenches TS can be crystallographically almost equivalent to those of the intersecting trenches TC. Consequently, the influence of the off-angle to the hexagonal c-plane can be reduced. Thus, a portion with a partially lower gate breakdown voltage can be eliminated. Particularly, a higher gate breakdown voltage is obtained by constructing a plane direction of the sidewalls using a plane equivalent to a (10-10) plane (i.e., a {10-10} plane).

Figure 6:
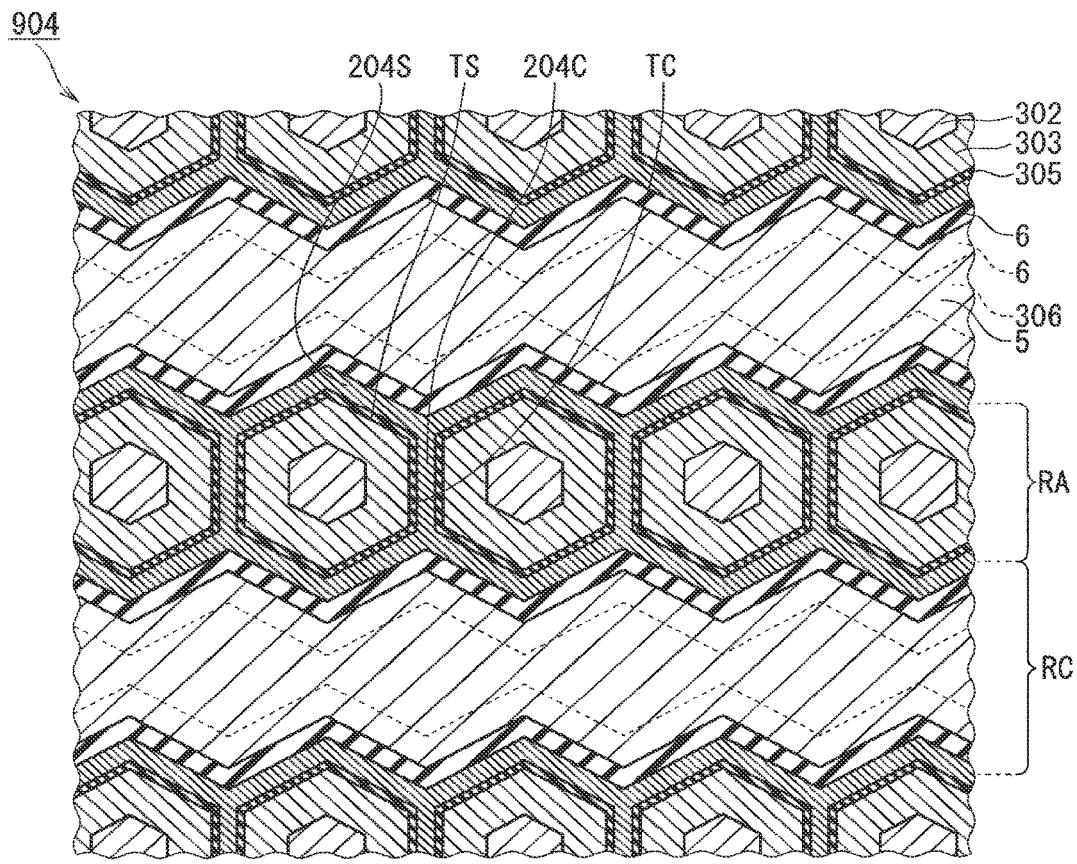
FIG. 6 is a partial sectional view schematically illustrating a modified structure of the semiconductor device of FIG. 2.

With reference to FIG. 6 illustrating an MOSFET 904 (a semiconductor device) of another modification, sidewalls of a striped trench TS have two different plane directions at an angle, and sidewalls of an intersecting trench TC have two plane directions parallel to each other. Preferably, the longitudinal direction (the horizontal direction in the drawing) of the striped active regions RA is a direction perpendicular to the off-direction of the off-angle, and the plane directions of the sidewalls of both the striped trenches TS and the intersecting trenches TC are equivalent to a (10-10) plane. The MOSFET 904 may have a higher channel width density with the sidewalls of the striped trenches TS zig-zagged. Preferably, a sidewall perpendicular to the off-direction of the off-angle is excluded from the striped active regions RA. The striped active regions RA include, for example, shapes of regular hexagons. Consequently, a higher gate breakdown voltage is obtained.

When the hexagons are used as the striped active regions RA, the hexagons need to include respective contacts to the base regions 302 and the source regions 303. Thus, the degree of manufacturing difficulty in reducing the width of the striped active regions RA to reduce the ON resistance may be somewhat high. If this point is problematic, shapes other than the hexagons may be used.

Figure 7:
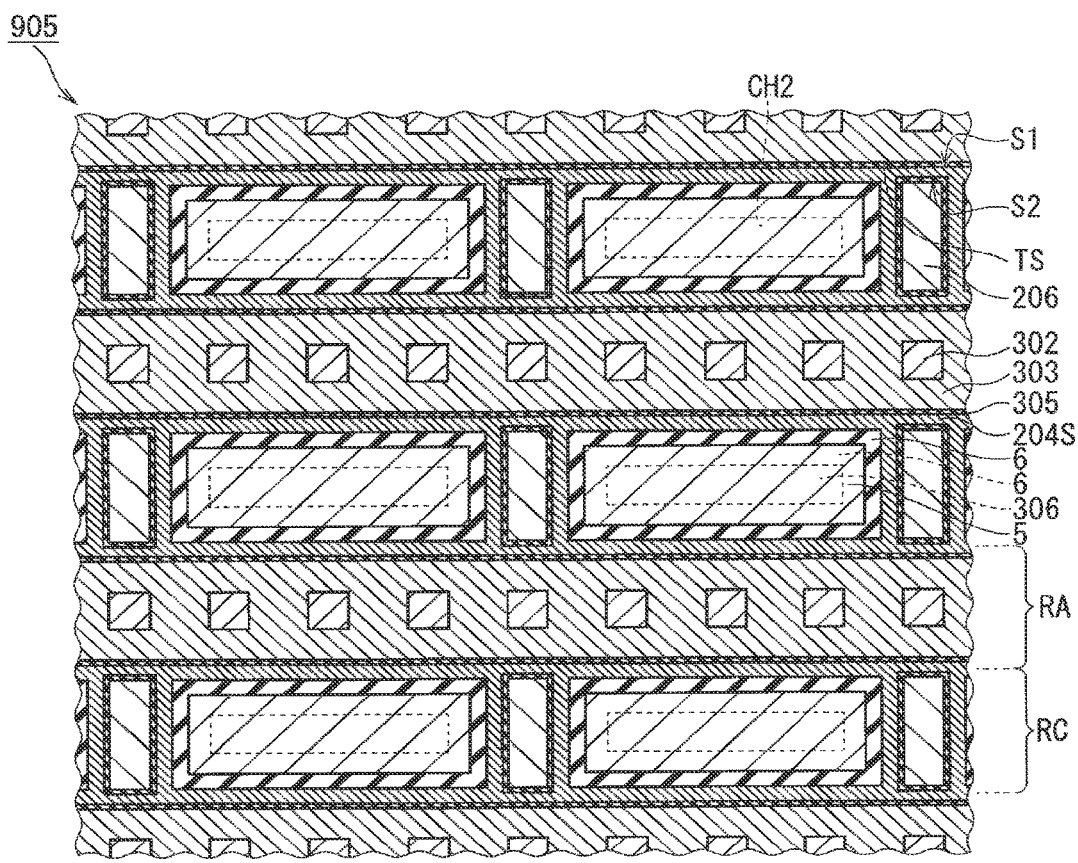
FIG. 7 is a partial sectional view schematically illustrating a modified structure of the semiconductor device of FIG. 2.

With reference to FIG. 7, an MOSFET 905 (a semiconductor device) of another modification further includes dummy regions 206 in addition to the structure of the MOSFET 901. The dummy regions 206 protrude from the bottom of the striped trenches TS toward its opening portions (upward in a field of view corresponding to FIG. 1) in the striped contact regions RC. The dummy regions 206 are insulated from the source electrode 5 by an insulating film, for example, the gate oxide film 305. Thus, the dummy regions 206 are separated from the source electrode 5.

The dummy regions 206 are preferably formed from a part of the epitaxial layer 100. Thus, etching for forming the striped trenches TS may be performed so that a portion of the epitaxial layer 100 to be the dummy regions 206 remains. The dummy regions 206 may include a portion made of the same material as that of the base regions 302 and the source regions 303. In view of ease of manufacture, the dummy regions 206 are preferably allowed to have the portion made of the same material as that of the base regions 302 and the source regions 303 to increase a margin of mask alignment. This eliminates the need for forming a resist mask for avoiding ion implantation to cover the dummy regions 206 when the base regions 302 and the source regions 303 are formed by ion implantation. When such a resist mask is formed, the degree of difficulty in a photolithography process will increase due to a smaller margin of mask alignment. When the dummy regions 206 do not have the portion made of the same material as that of the base regions 302 and the source regions 303, the dummy regions 206 may be formed of only the sane material as that of the drift layer 2.

In the present modification, each of the striped gate electrodes 204S has a portion adjacent to a side surface of the dummy region 206. The side surface mutually connects two adjacent portions of the striped gate electrode 204S which sandwich one of the striped contact regions RC, in a direction perpendicular to the longitudinal direction (the vertical direction in FIG. 7). In other words, the striped gate electrodes 204S are ladder-shaped. Even when the striped gate electrodes 204S are torn by pattern defects or by the influence of particles, as long as one of the two portions of the striped gate electrode 204S is normal, a gate potential can be applied to both of the portions. Consequently, the influence of the tearing can be reduced. The dummy regions 206 may have shapes other than the rectangle illustrated in FIG. 7, for example, a hexagon with planes each equivalent to the (10-10) plane.

Figure 8:
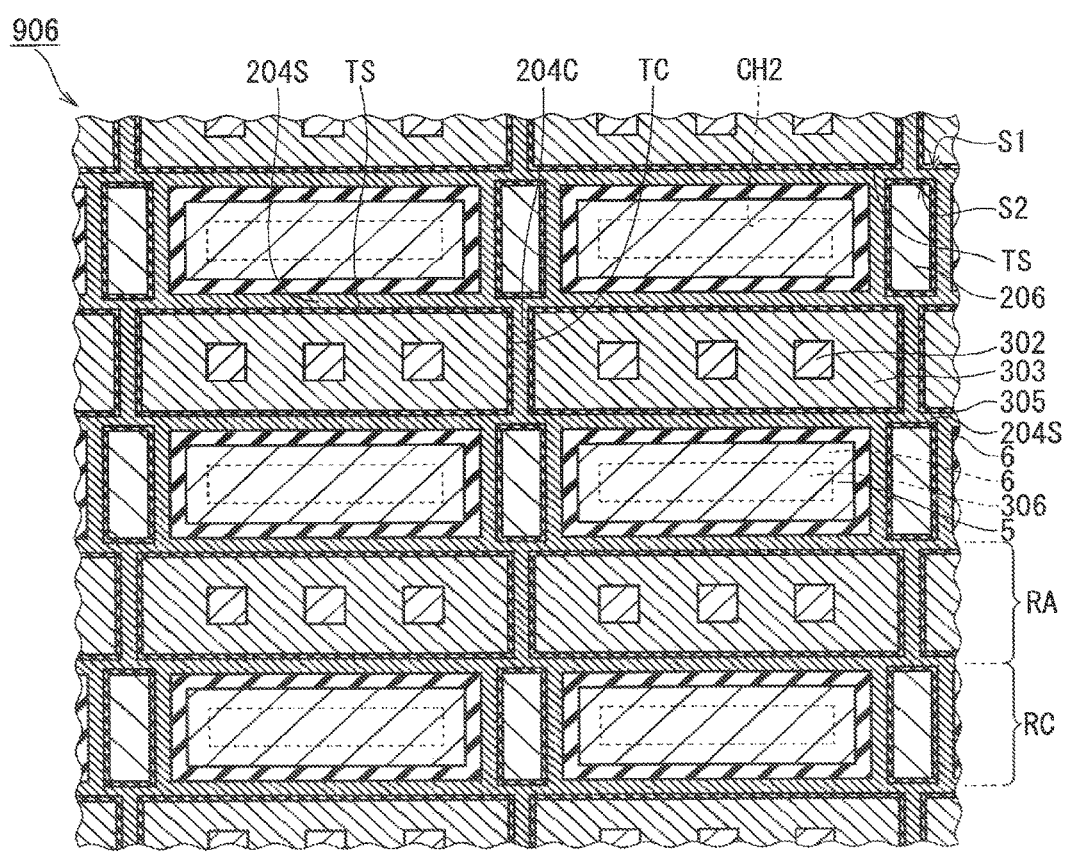
FIG. 8 is a partial sectional view schematically illustrating a modified structure of the semiconductor device of FIG. 2.

The characteristic structure of the MOSFET 905 may be combined with the characteristic structures of the MOSFETs 902 to 904 (FIGS. 4 to 6). For example, an MOSFET 906 (FIG. 8) has a structure obtained by combining the characteristic structure of the MOSFET 905 (FIG. 7) with the characteristic structure of the MOSFET 902 (FIG. 4). In this structure, gate electrodes are formed into meshes over both the striped active regions RA and the striped contact regions RC. Thus, the maximum distance between a position in the gate electrode and a gate leading electrode (not illustrated) can be reduced.

Figure 9:
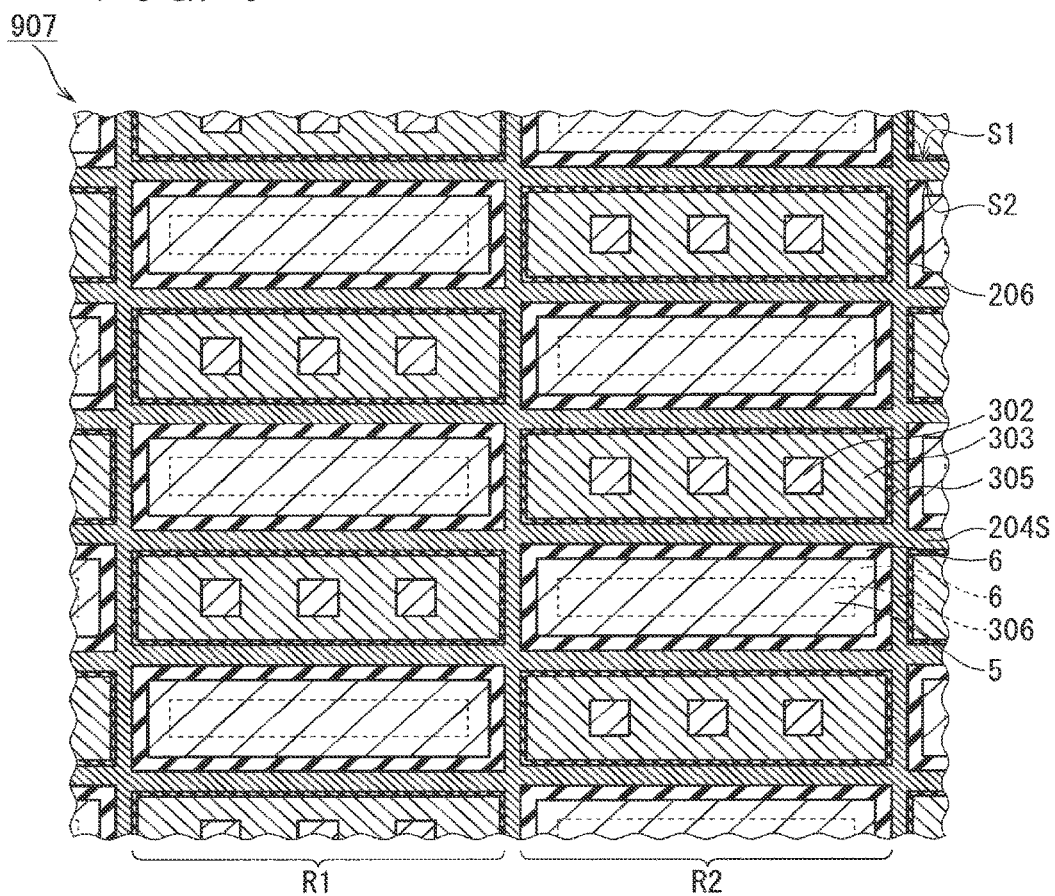
FIG. 9 is a partial sectional view schematically illustrating a modified structure of the semiconductor device of FIG. 2.

With reference to FIG. 9, an MOSFET 907 (a semiconductor device) of a modification has a structure obtained by changing positions of the striped active regions RA and the striped contact regions RC in the MOSFET 901 (FIG. 2) at regular intervals. Consequently, the MOSFET 907 has a portion in which the striped active region RA and the striped contact region RC are facing to each other in the longitudinal direction (the horizontal direction in FIG. 9). In the MOSFET 907, this portion also includes the sniped gate electrode 204S. Even without the dummy regions 206 (FIG. 7), this portion can mutually connect the two adjacent portions of the striped gate electrodes 204S in the direction perpendicular to the longitudinal direction (the vertical direction in FIG. 9).

In other words, the MOSFET 907 includes a first row R1 and a second row R2 in each of which the striped active regions RA and the striped contact regions RC are alternately and repeatedly disposed. Each of the first row R1 and the second row R2 extends in a direction transverse to the longitudinal direction, specifically, in a direction orthogonal to the longitudinal direction. The striped active regions RA in the first row R1 are facing the striped contact regions RC in the second row R2 in the longitudinal direction (the horizontal direction in the drawing). The striped contact regions RC in the first row R1 are facing the striped active regions RA in the second row R2 in the longitudinal direction. Although the "first" and "second" rows mentioned above, the number of rows is any number larger than or equal to two.

In the present modification, the striped active regions RA in the first row R1 and the striped contact regions RC in the second row R2 facing to each other in the longitudinal direction enable the gate electrodes to extend between the regions. Consequently, the gate electrodes can be formed into meshes. Thus, the maximum distance between a position in the gate electrode and a gate leading electrode (not illustrated) can be reduced.

According to Embodiment 1, the striped active regions RA through which a main current conducts and the striped contact regions RC with the protective-diffusion-layer grounding regions PC are alternately disposed as illustrated in FIG. 2. Consequently, variations in distance from the protective-diffusion-layer grounding region PC to the protective diffusion layer 306 at the bottom of each of the trenches are reduced. Thus, the breakage of the gate oxide film 305 caused by current crowding in a transient response can be reduced.

According to Embodiment 1, the second side surface S2 of the striped gate electrode 204S is covered with a thickness larger than that of the gate oxide film 305. Consequently, the capacitance between the source electrode 5 and the second side surface S2 of the striped gate electrode 204S facing the source electrode 5 is reduced. Thus, the switching speed can be increased.

Generally, a threshold voltage, at which an MOSFET is switched ON and OFF, and an ON resistance have a trade-off relationship. Although the threshold voltage is preferably higher in consideration of noise immunity, increase in the threshold voltage increases the ON resistance with such a trade-off. Conversely, although the ON resistance is preferably lower in consideration of loss reduction, decrease in the ON resistance decreases the threshold voltage with the trade-off. This trade-off needs to be improved so that increase in the noise immunity and the loss reduction will mutually become compatible. The threshold voltage is an evaluation indicator at which a channel is switched ON and OFF in a range with a high channel resistance. In contrast, the ON resistance is an evaluation indicator in a range with a low channel resistance when a sufficient electric field is applied to a gate. Since the channel width density reduced in the structure of Embodiment 1, a threshold, which is an indicator in a region with a larger channel resistance contribution, increases. In contrast, the ON resistance, which is an indicator in a range with a smaller channel resistance contribution, can be rarely increased. Thus, Embodiment 1 can improve the trade-off between the threshold and the ON resistance.

The protective diffusion layers 306 are preferably higher in p-type impurity concentration than the base regions 302. Thus, the advantage of the protective diffusion layers 306 can be fully obtained.

When the drift layer 2 is made of a wide-bandgap semiconductor, a higher switching speed is obtained in combination with the structure according to Embodiment 1. Although an electrical breakdown easily occurs in a gate oxide film of an MOSFET using a wide-bandgap semiconductor in general, such a breakdown can be reduced.

Next, a method for manufacturing the MOSFET 901 (FIG. 1) will be hereinafter described. Materials to be exemplified in the following description can be changed to the other materials with equivalent functions as necessary.

Figure 10:
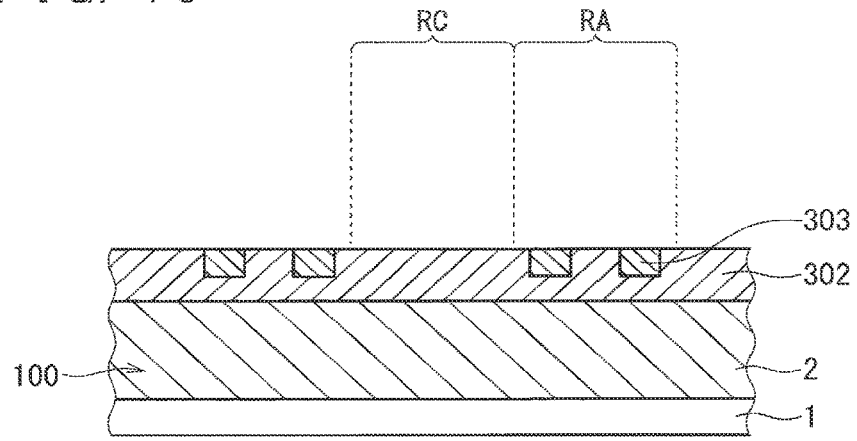
FIG. 10 is a partial sectional view schematically illustrating a process of a method for manufacturing the semiconductor device of FIG. 1.

With reference to FIG. 10, first, the epitaxial layer 100 is formed on the substrate 1. For example, the n-type epitaxial layer 100 is formed on an n-type semiconductor substrate of a 4H polytype and with a low resistance by chemical vapor deposition (CVD). The epitaxial layer 100 has, for example, an impurity concentration ranging from $1 \times 10^{14}$ cm$^{-3}$ to $1 \times 10^{17}$ cm$^{-3}$ and a thickness ranging from 5 µm to 200 µm.

Next, a predetermined dopant is ion-implanted on the surface of the epitaxial layer 100 to form the base region 302 and the source regions 303. These processes will be specifically described hereinafter.

The base region 302 is formed by ion-implanting aluminum (Al) that is a p-type impurity (acceptor). The depth of the ion-implanted Al approximately ranges from 0.5 µm to 3 µm which does not exceed the thickness of the epitaxial layer 100. The impurity concentration of Al to be implanted is higher than the n-type impurity concentration of the epitaxial layer 100. In other words, the p-type impurity concentration of the base region 302 ranges from $1 \times 10^{17}$ cm$^{-3}$ to $1 \times 10^{20}$ cm$^{-3}$. Here, a region of the epitaxial layer 100 deeper than the implanted Al remains as the n-type drift layer 2. The base region 302 may be formed by epitaxially growing a p-type semiconductor. In such a case, the impurity concentration and the thickness of the base region 302 are made equivalent to those of the base region 302 formed by ion implantation.

The source region 303 is formed by ion implanting nitrogen (N) that is an n-type impurity (donor) on the surface of the base region 302. The source region 303 is formed into a pattern corresponding to the layout of the striped gate electrodes 204S to be formed later. When the striped gate electrodes 204S are formed, the source regions 303 are located in both sides of the striped gate electrodes 204S. The depth of the ion-implanted N is shallower than the thickness of the base region 302. The impurity concentration of the ion-implanted N ranges from the p-type impurity concentration of the base region 302 to $1 \times 10^{21}$ cm$^{-3}$. As long as the structure in FIG. 10 is ultimately obtained, the order of the ion implantation for forming the impurity regions may not be the order described above.

A depletion prevention layer may be formed under the base region 302. In the structure of FIG. 1, the depletion layer extending from each of the base region 302 and the protective diffusion layer 306 narrows a current path between the base region 302 and the protective diffusion layer 306. This leads to the generally-called JFET resistance. The depletion prevention layer is added to prevent the depletion layer from extending from the base region 302 in an ON time. Thus, the JFET resistance can be reduced. The depletion prevention layer is formed by ion-implanting nitrogen (N) or phosphorus (P) which is an n-type impurity. The depletion prevention layer is deeper than the base region 302. The depth of the depletion prevention layer falls within a range that does not exceed the thickness of the epitaxial layer 100. The depletion prevention layer preferably has a thickness ranging approximately from 0.5 µm to 3 µm. Preferably, the impurity concentration of the ion-implanted N is higher than the n-type impurity concentration of the deposited epitaxial layer 100 and higher than or equal to $1 \times 10^{17}$ cm$^{-3}$. The depletion prevention layer may be formed by n-type epitaxial growth. In such a case, the impurity concentration and the thickness of the depletion prevention layer are made equivalent to those of a depletion prevention layer formed by ion implantation.

With reference to FIG. 11, a silicon oxide film 10 is then deposited on the surface of the epitaxial layer 100 with a thickness ranging approximately from 1 µm to 2 µm. An etching mask 11 made of a resist material is formed thereon. The etching mask 11 is provided with a pattern of opening regions to be the striped trenches TS (FIG. 1) according to a photolithography technique. Then, the silicon oxide film 10 is patterned by reactive-ion etching (RIE) using the etching mask 11 as a mask. In other words, the pattern of etching mask 11 is transferred to the silicon oxide film 10. The patterned silicon oxide film 10 is used as the next etching mask.

With reference to FIG. 12, the striped trenches TS that penetrate the source regions 303 and the base region 302 are formed in the epitaxial layer 100 by RIE using the patterned silicon oxide film 10 as a mask. The depth of the striped trenches TS is larger than or equal to the depth of the base region 302, and approximately ranges from 1.0 µm to 6.0 µm.

Figure 13:
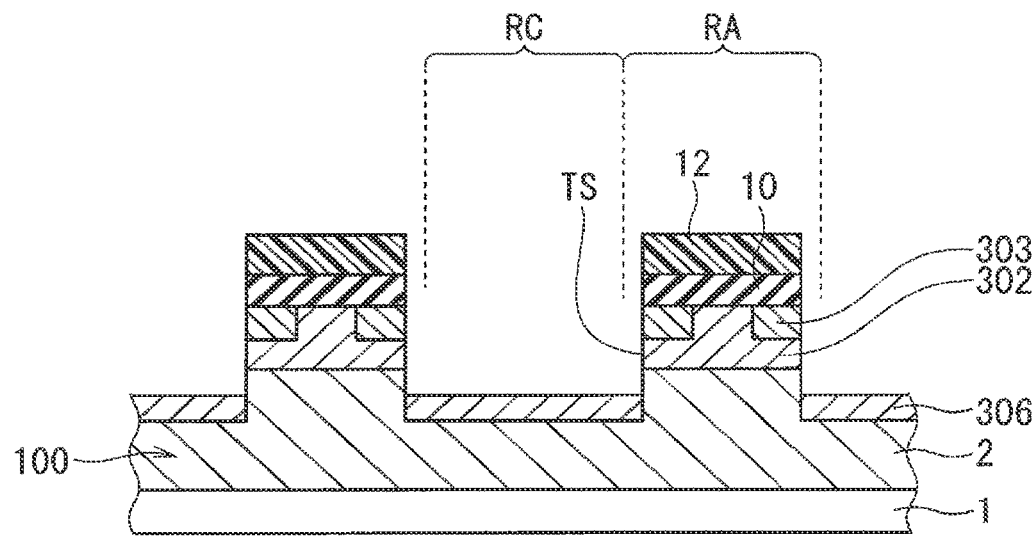
FIG. 13 is a partial sectional view schematically illustrating a process of method for manufacturing the semiconductor device of FIG. 1.

With reference to FIG. 13, an implantation mask 12 having an opening pattern that exposes the striped trenches TS, that is, a pattern identical to that of the etching mask 11 is formed then. Through the ion implantation using the implantation mask 12, the p-type protective diffusion layers 306 are formed at the bottom of the striped trenches TS. Here, Al is used as a p-type impurity. The protective diffusion layers 306 to be formed preferably have an impurity concentration ranging from $1 \times 10^{17}$ cm$^{-3}$ to $1 \times 10^{19}$ cm$^{-3}$ and a thickness ranging from 0.1 µm to 2.0 µm. The impurity concentration is determined by an electric field applied to the oxide film 305 with application of a breakdown voltage of use between the drain and the source of the MOSFET 901. The (patterned) silicon oxide film 10 (FIG. 12), which is an etching mask for forming the striped trenches TS, may be used instead of the implantation mask 12. Consequently, the manufacturing processes can be simplified, and the cost can be reduced. In such a case, the thickness and the etching conditions of the silicon oxide film 10 to be formed need to be adjusted so that the silicon oxide film 10 with a sufficient thickness remains after etching to form the striped trenches TS.

Since the protective diffusion layer 306 forms a p-n junction with the drift layer 2, the MOSFET 901 (FIG. 1) finally obtained may use this p-n junction as a diode. Here, a p-n junction between the base region 302 and the drift layer 2 may also function as a diode. When these two types of diodes function as free-wheeling diodes, a current flowing through the diode between the protective diffusion layer 306 and the drift layer 2 preferably accounts for the majority of the current. This is because the excessive energization of the diode formed with the base region 302 may create a phenomenon that the defects extending from the substrate 1 reach the vicinity of the gate oxide film 305, and ultimately break down the gate oxide film 305. To enable avoidance of this phenomenon, the Al impurity concentration of the protective diffusion layers 306 needs to be determined in consideration of the Al impurity concentration of the base regions 302. The portion of the drift layer 2 that is in contact with the protective diffusion layer 306 is thinner by the depth of the striped trench TS than the other portions. Thus, if the protective diffusion layer 306 has the Al impurity concentration higher than or equal to that of the base region 302, the majority of the current is allowed to flow through the diode formed with the protective diffusion layer 306.

However, influence of the extending defects caused by the energization of the diode formed with the protective diffusion layer 306 may not be negligible. This is because the bottom of the gate oxide film 305 is in contact with the protective diffusion layer 306. Thus, to prevent the gate oxide film 305 from breaking down due to the extending defects, the gate oxide film 305 preferably has a portion facing the bottom of the striped trench TS thicker than a portion facing the sidewall of the striped trench TS.

Next, the implantation mask 12 is removed. Then, a heat treatment apparatus performs annealing to activate the impurities ion-implanted through the above processes. This annealing is performed in a vacuum or in an inert gas atmosphere such as argon (Ar) gas between 1300 and 1900° C. for 30 seconds to 1 hour.

Figure 14:
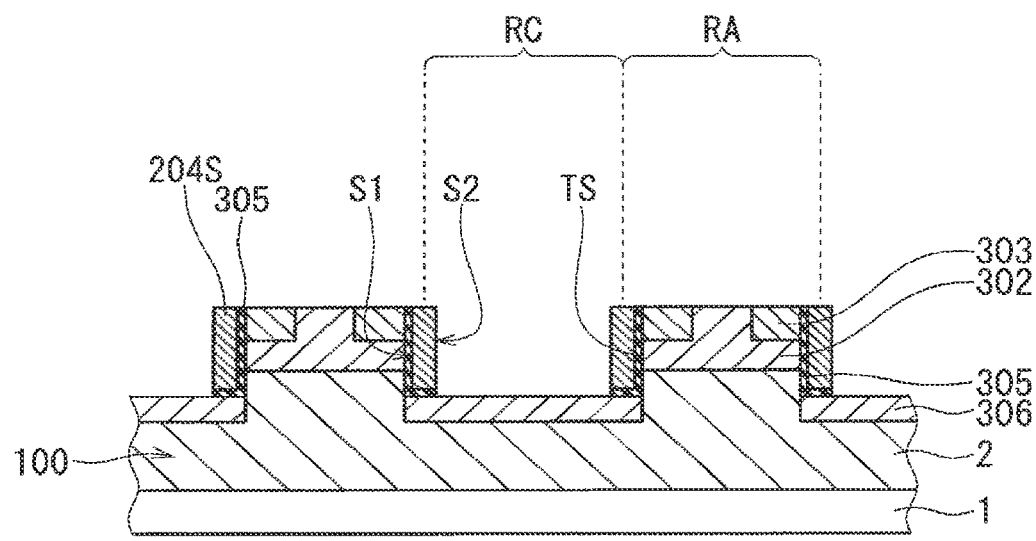
FIG. 14 is a partial sectional view schematically illustrating a process of the method for manufacturing the semiconductor device of FIG. 1.

With reference to FIG. 14, a silicon oxide film is then formed on the entire surface of the epitaxial layer 100 including the striped trenches TS. Next, depositing polysilicon by low-pressure CVD forms a polysilicon film having conductivity. These films are patterned or etch-backed to form the gate oxide film 305 and the striped gate electrodes 204S. The silicon oxide film to be the gate oxide film 305 may be formed by thermally oxidizing the surface of the epitaxial layer 100 or by a deposition process.

Figure 15:
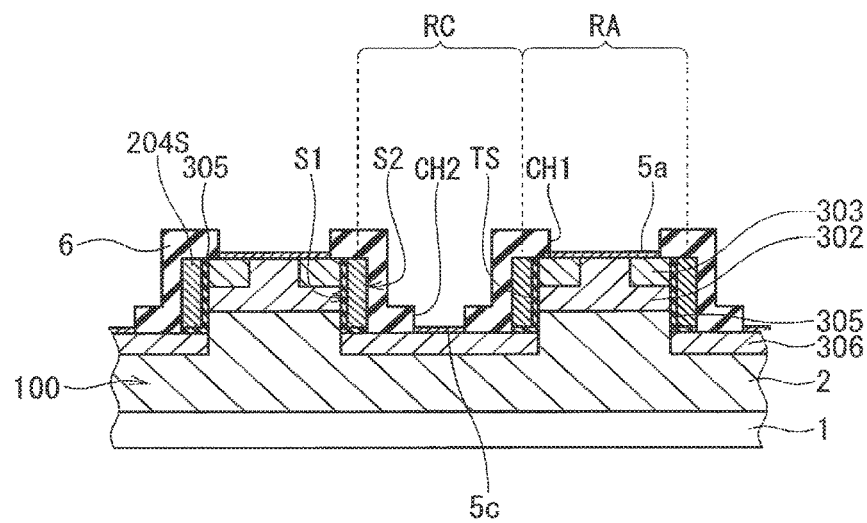
FIG. 15 is a partial sectional view schematically illustrating a process of the method for manufacturing the semiconductor device of FIG. 1.

With reference to FIG. 15, the interlayer oxide film 6 that covers the striped gate electrodes 204S is then formed on the entire surface of the epitaxial layer 100 by low-pressure CVD. Next, patterning the interlayer oxide film 6 forms the first contact holes CH1 and the second contact holes CH2. Then, the ohmic electrode portions 5a and the ohmic electrode portions 5c are formed on the surface of the epitaxial layer 100 exposed at the bottom of the first contact holes CH1 and the second contact holes CH2, respectively. The formation method begins with, for example, forming a metal film that mainly contains Ni on the interlayer oxide film 6. Through this formation, the metal film is formed also in the first contact holes CH1 and the second contact holes CH2. Then, a thermal treatment between 600 to 1100° C. allows the metal film in the first contact holes CH1 and the second contact holes CH2 to react with SiC of the epitaxial layer 100. Consequently, silicide films are formed as the ohmic electrode portions 5a and 5c. Then, the metal film unreacted and remaining on the interlayer oxide film 6 is removed by wet-etching using, for example, nitric acid, sulfuric acid, hydrochloric acid, or a mixture solution of these acids and hydrogen peroxide solution. The thermal treatment may be performed again to further reduce the contact resistance of the ohmic contact. The second thermal treatment is preferably performed at a temperature higher than that of the previous thermal treatment.

When the minimum distance between each of the ohmic electrode portions 5a and 5c and the corresponding striped gate electrode 204S is excessively shorter in the thermal treatment, each of the ohmic electrode portions 5a and 5c easily reacts with the striped gate electrode 204S. This reaction causes gate leakage in the MOSFET 901. Thus, the dimension of the interlayer oxide film 6 is preferably determined to avoid such a reaction. Specifically, the dimension of the interlayer oxide film 6 is preferably determined so that the interlayer oxide film 6 that separates each of the ohmic electrode portions 5a and 5c from the striped gate electrode 204S has no excessively thin portion.

Again with reference to FIG. 1, depositing an electrode material such as an Al alloy on the epitaxial layer 100 forms the source electrode 5 on the interlayer oxide film 6 and in the first contact holes CH1 and the second contact holes CH2. Next, depositing an electrode material such as an Al alloy on the lower surface of the substrate 1 forms the drain electrode 7. Consequently, the MOSFET 901 is obtained.

Although the MOSFET has a structure including the drift layer 2 and the substrate 1 (a buffer layer) with the same conductivity type in the description above, forming, as a collector layer, a portion with the conductivity type different from that of the drift layer 2 on a lower surface of a semiconductor region (a surface facing the drain electrode 7) can yield an IGBT. For example, a p-type substrate may replace the n-type substrate 1 in the MOSFET 901 (FIG. 1). Alternatively, a p-type semiconductor layer may replace the n-type substrate 1. Alternatively, a p-type semiconductor layer to be the lower surface of the semiconductor region may be formed on the lower surface of the n-type substrate 1. Here, the source region 303 and the source electrode 5 of the MOSFET 901 correspond to an emitter region and an emitter electrode of IGBT, respectively, and the drain electrode 7 of the MOSFET 901 corresponds to a collector electrode of the IGBT.

Although the first conductivity type is n-type and the second conductivity type is p-type in the description above, these conductivity types may be replaced with each other.

Although SiC, which is one of the wide-bandgap semiconductors, is used as a semiconductor material in the description above, the other wide-bandgap semiconductors such as a gallium nitride (GaN) based material and diamond may be used. A non-wide bandgap semiconductor such as Si may replace the wide-bandgap semiconductor.

Embodiment 2

Figure 16:
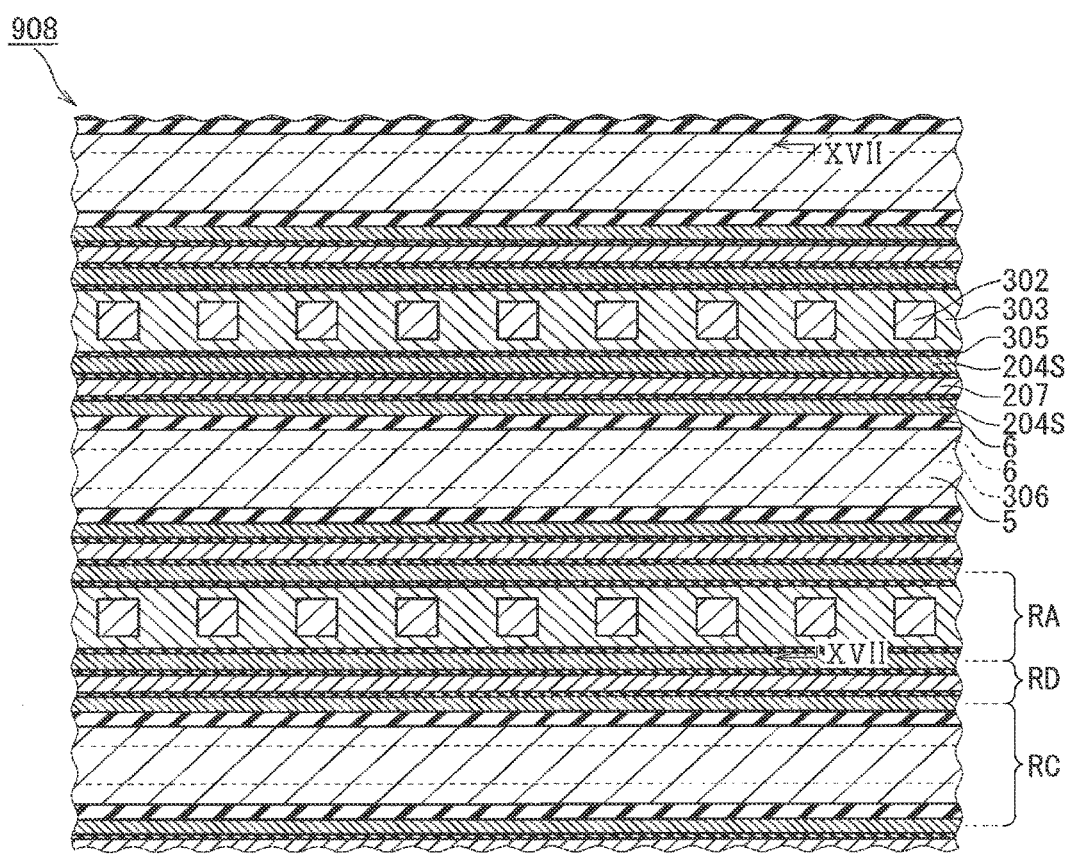
FIG. 16 is a partial sectional view taken along the line XVI-XVI of FIG. 17 and schematically illustrating a structure of a semiconductor device according to Embodiment 2 of the present invention with a field of view corresponding to a plan view.
Figure 17:
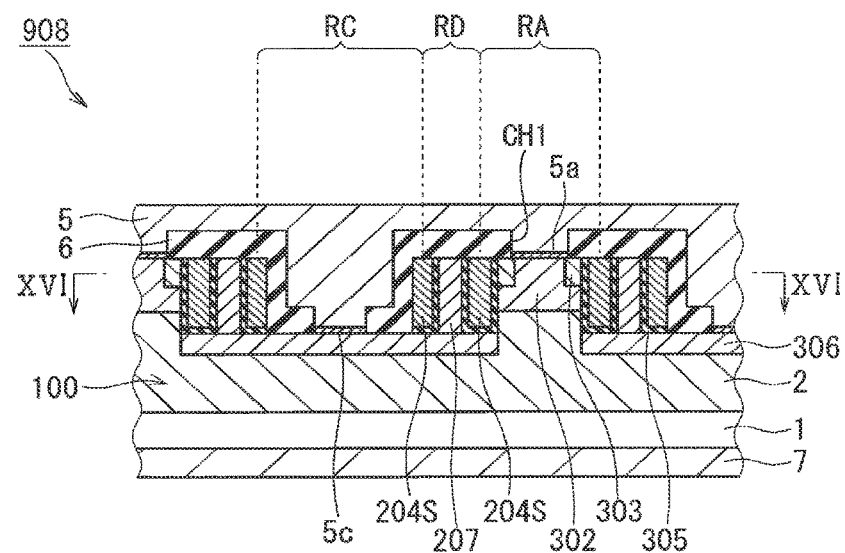
FIG. 17 is a partial sectional view taken along the line XVII-XVII of FIG. 16 and schematically illustrating the structure of the semiconductor device according to Embodiment 2 of the present invention with a field of view along a thickness direction.

FIGS. 16 and 17 each is a partial sectional view schematically illustrating a structure of an MOSFET 908 (a semiconductor device) according to Embodiment 2. The field of view of FIG. 16 is shown along the line XVI-XVI of FIG. 17, and the field of view of FIG. 17 is shown along the line XVII-XVII of FIG. 16. The field of view of FIG. 16 is the same as that of FIG. 2, and the field of view of FIG. 17 is the same as that of FIG. 1.

The MOSFET 908 further includes supporting regions 207 in addition to the structure of the MOSFET 901 (FIGS. 1 and 2). Each of the supporting regions 207 protrudes from the bottom of the striped trench TS and away from the source electrode 5 between the striped active region RA and the striped contact region RC. Thus, the supporting regions 207 are not connected to the source electrode 5; the supporting regions 207, therefore, do not have any electrical function. The supporting regions 207 each have a pair of side surfaces that are opposite to each other. The striped gate electrodes 204S have portions adjacent to the pairs of the side surfaces of the supporting regions 207. These portions of the striped gate electrodes 204S are mutually connected to be electrically short-circuited. Of these portions, only a portion between the supporting region 207 and the base region 302 has a function of generating an electric field for controlling a channel of an MOSFET element. The supporting regions 207 are preferably disposed on the protective diffusion layers 306 as illustrated in FIG. 17.

The supporting regions 207 are formed from a part of the epitaxial layer 100. To obtain such a structure, etching for forming the striped trenches TS may be performed so that a portion of the epitaxial layer 100 to be the supporting regions 207 remains. In such a case, the entirety of the supporting regions 207 may be made of the same material as that of the drift layer 2, or a part of the supporting regions 207 may include portions made of the same material as that of the base regions 302 or the source regions 303.

In other words, the MOSFET 908 includes striped dummy regions RD between the striped active regions RA and the striped contact regions RC. In the striped dummy regions RD, portions of the epitaxial layer 100 as the supporting regions 207 protrude from the bottom of the striped trenches TS toward the lower surface of the interlayer oxide film 6.

Since the structure other than the described structure is the same as that according to Embodiment 1, the same reference numerals are assigned to the same or corresponding elements and the description thereof will not be repeated.

Forming the striped contact regions RC can increase the switching speed in Embodiment 2 similarly as Embodiment 1. On the other hand, the switching speed largely depends on a gate resistance, which is a resistance to an MOSFET seen from a gate circuit side. Specifically, as the gate resistance is smaller, the switching speed increases. Generally, the switching speed is adjusted using a resistor connected in series with a gate terminal of an MOSFET and disposed on the gate circuit side. The smaller the gate resistance of the MOSFET itself is, the larger the adjustment range of the switching speed can be reserved.

Although a method for changing a position of a gate leading electrode is applicable to reduce a gate resistance, the simplest and the most effective method is to increase a cross-sectional area of a gate electrode. The cross-sectional area of the gate electrode depends on the height (i.e., a depth of a trench) and the width of the gate electrode. For a trench-gate MOSFET for controlling power, deepening its trenches reduces the drain breakdown voltage and thus is disadvantageous. Thus, the width of the gate electrode needs to be broadened to increase its cross-sectional area. The amount of a polysilicon film to be deposited to form the striped gate electrodes 204S needs to be increased to increase the width of the striped gate electrodes 204S in the structure and the manufacturing method according to Embodiment 1. However, this method has a problem with increasing the deposition time and the subsequent dry-etching time.

In contrast, the striped gate electrodes 204S have the portions adjacent to the pairs of the side surfaces of the supporting regions 207 in the MOSFET 908 according to Embodiment 2. Even without increasing the thickness of the polysilicon film as described above, the cross-sectional area of the striped gate electrodes 204S can be increased to the same extent as when this thickness of the polysilicon film is doubled. As the gate resistance is reduced, the switching speed can be increased.

The MOSFET 908 can be manufactured by merely changing the layout of the mask for transferring the pattern to be used in forming the striped trenches TS (FIG. 12) in the method for manufacturing the MOSFET 901 according to Embodiment 1. Specifically, the supporting regions 207 may be prevented from being etched in etching the epitaxial layer 100 to form the striped trenches TS. Thus, the MOSFET can be manufactured with the same number of processes as that of Embodiment 1 while obtaining the advantages.

The supporting regions 207 may function as a sort of implantation mask in ion implantation for forming the protective diffusion layers 306. Thus, when the width (a dimension in the horizontal direction in FIG. 17) of the supporting regions 207 is larger, the protective diffusion layers 306 may have a break under the supporting regions 207. However, as long as the width of the supporting regions 207 is set smaller to some extent, such a break can be avoided by spreading of the implanted dopant in the horizontal direction. Alternatively, forming the protective diffusion layers 306 by ion implantation may precede formation of the striped trenches TS. Here, the growth of the epitaxial layer 100 is suspended in midstream, and restarted after implantation of the protective diffusion layers 306. Then, the base regions 302 and the source regions 303, and further the striped trenches TS are formed.

When the striped dummy regions RD are formed in the limited area of the MOSFET as Embodiment 2, the number of the striped active regions RA has to be reduced. Although there is a concern about increase in the ON resistance in this case, the channel resistance contribution is smaller under the sufficiently large gate field as described above. Thus, increase in the ON resistance is negligible when the sufficient gate field can be applied.

The modifications identical to those of Embodiment 1 are applicable to Embodiment 2. As an additional remark on the equivalents of the MOSFET 907 (FIG. 9) among these modifications, the striped active regions RA, the striped dummy regions RD, and the striped contact regions RC may change positions at regular intervals.

Embodiment 3

Figure 18:
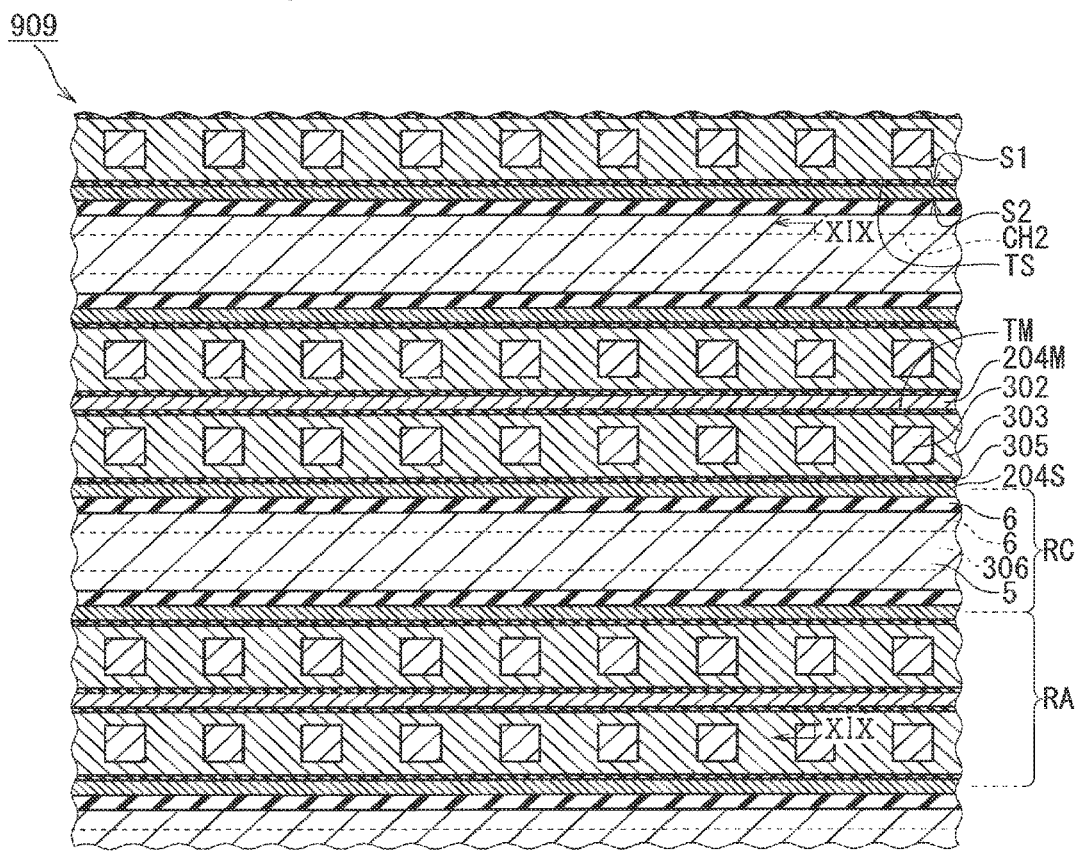
FIG. 18 is a partial sectional view taken along the line XVIII-XVIII of FIG. 19 and schematically illustrating a structure of a semiconductor device according to Embodiment 3 of the present invention with a field of view corresponding to a plan view.
Figure 19:
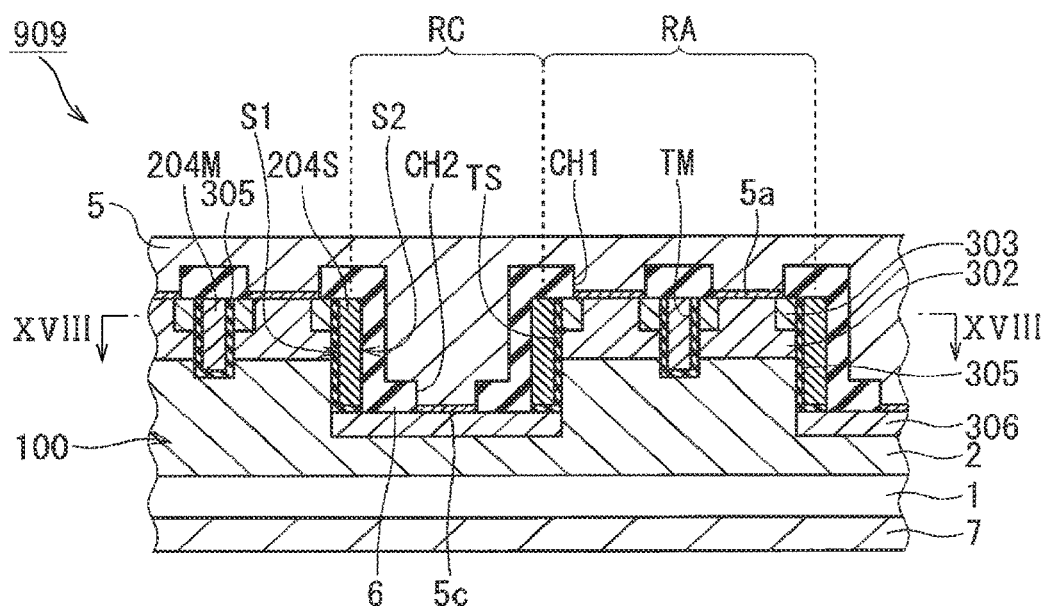
FIG. 19 is a partial sectional view taken along the line XIX-XIX of FIG. 18 and schematically illustrating the structure of the semiconductor device according to Embodiment 3 of the present invention with a field of view along a thickness direction.

FIGS. 18 and 19 each is a partial sectional view schematically illustrating a structure of an MOSFET 909 (a semiconductor device) according to Embodiment 3. The field of view of FIG. 18 is shown along the line XVIII-XVIII of FIG. 19, and the field of view of FIG. 19 is shown along the line XIX-XIX of FIG. 18. The field of view of FIG. 18 is the same as that of FIG. 2, and the field of view of FIG. 19 is the same as that of FIG. 1.

The MOSFET 909 differs from the MOSFET 901 only in the structure of the striped active regions RA. Specifically, the MOSFET 909 further includes intermediate trenches TM and intermediate gate electrodes 204M in addition to the structure of the MOSFET 901 (FIGS. 1 and 2). The intermediate trenches TM are formed between the two adjacent striped trenches TS. The intermediate trench TM penetrates the source region 303 and the base region 302 to reach the drift layer 2. The intermediate trenches TM are shallower than the striped trenches TS. The protective diffusion layer 306 is not disposed at the bottom of the intermediate trenches TM.

Each of the intermediate gate electrodes 204M forms a gate electrode of the MOSFET 909 together with the striped gate electrode 204S. The intermediate gate electrode 204M is adjacent to the base regions 302 through the gate oxide film 305 in the intermediate trench TM. With the intermediate gate electrodes 204M, a channel is also formed between the two adjacent striped trenches TS.

Since the structure other than the described structure is the same as that according to Embodiment 1, the same reference numerals are assigned to the same or corresponding elements and the description thereof will not be repeated.

According to Embodiment 3, the intermediate trenches TM are shallower than the striped trenches TS, and the protective diffusion layer 306 is not disposed at the bottom of the intermediate trenches TM. With this structure, the dependence of the ON resistance on the temperature can be improved. This will be described hereinafter in detail.

In the MOSFET 901 (FIGS. 1 and 2) according to Embodiment 1, when the width of the striped active regions RA is reduced with the intention of increasing the channel width density, the distance between the adjacent protective diffusion layers 306 is also reduced. Since the drain-source current path is narrowed, the ON resistance may increase. Particularly when an ambient operating temperature is higher, the depletion layer between the protective diffusion layers 306 and the drift layer 2 extends longer. Thus, the current path is more narrowed, and the ON resistance further increases. To avoid this, it is necessary to increase the distance between the adjacent protective diffusion layers 306, that is, to broaden the width of the striped active regions RA. This means reduction in the channel width density. Under conditions allowing application of a sufficiently large gate field, this hardly poses any problem because the channel resistance contribution is smaller as described above. However, a sufficiently large gate field may not be applicable, and the ON resistance will sharply increase in such a case. Since the drain-source current path largely detours along the depletion layer between the protective diffusion layers 306 and the drift layer 2 in the structure of Embodiment 1, all the current paths contain excessive resistance.

In contrast, since the MOSFET 909 (FIGS. 18 and 19) according to Embodiment 3 does not include the protective diffusion layer 306 immediately below the intermediate trenches TM, a current path from the channels to be controlled by the intermediate gate electrodes 204M to the drain electrode 7 is linear without requiring the detour. The electric field concentration at the bottom of the intermediate trenches TM can be relaxed by the depletion layer extending from the protective diffusion layers 306 disposed at the bottom of the striped trenches TS. This relaxing effect can be increased by forming the intermediate trenches TM shallower than the striped trenches TS. The width of the striped contact regions RC is preferably smaller. These values of depth and width are determined by a relationship in impurity concentration between the drift layer 2 and the protective diffusion layers 306.

In other words, this structure can reduce the resistant along the drain-source current path. Even when the higher ambient operating temperature causes the depletion layer between the protective diffusion layers 306 and the drift layer 2 to extend longer in the ON state, the depletion layer is not formed immediately below the channels to be controlled by the intermediate gate electrodes 204M. Thus, increase in the ON resistance can be reduced.

Figure 20:
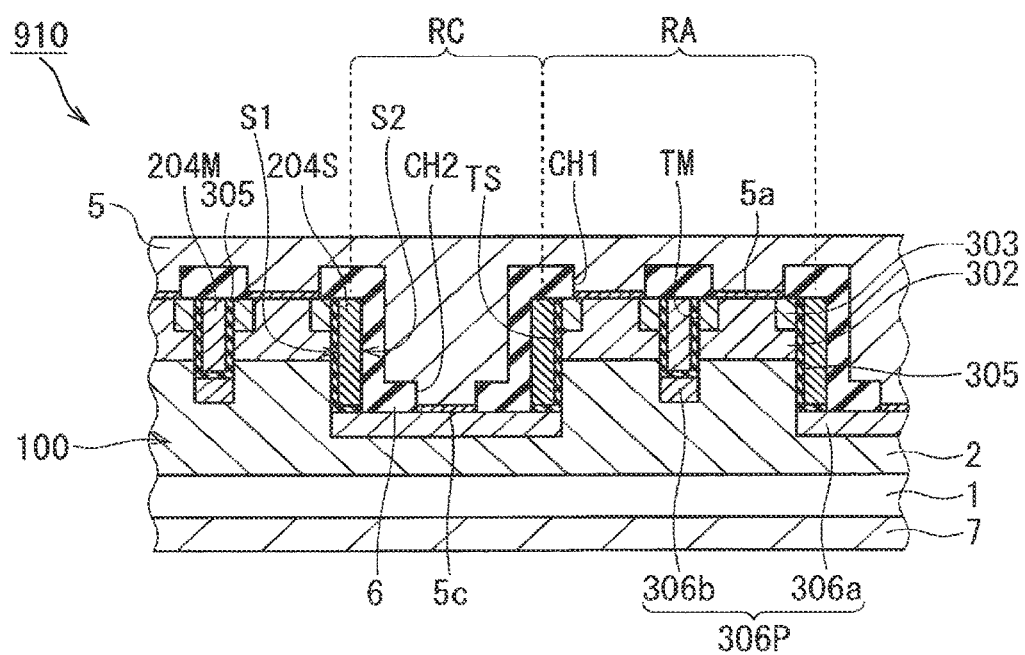
FIG. 20 is a partial sectional view schematically illustrating a modified structure of the semiconductor device of FIG. 19.

With reference to FIG. 20, protective diffusion layers 306P in an MOSFET 910 (a semiconductor device) of a modification include first portions 306a disposed at the bottom of the striped trenches TS and second portions 306b disposed at the bottom of the intermediate trenches TM. The second portion 306b is lower in impurity concentration than the first portion 306a. This modification can obtain the similar advantages above. The electric field relaxed by the second portions 306b can reliably prevent the gate oxide film 305 at the bottom of the intermediate trenches TM from breaking down.

The modifications identical to those of Embodiment 1 are applicable to Embodiment 3.

Embodiment 4

Figure 21:
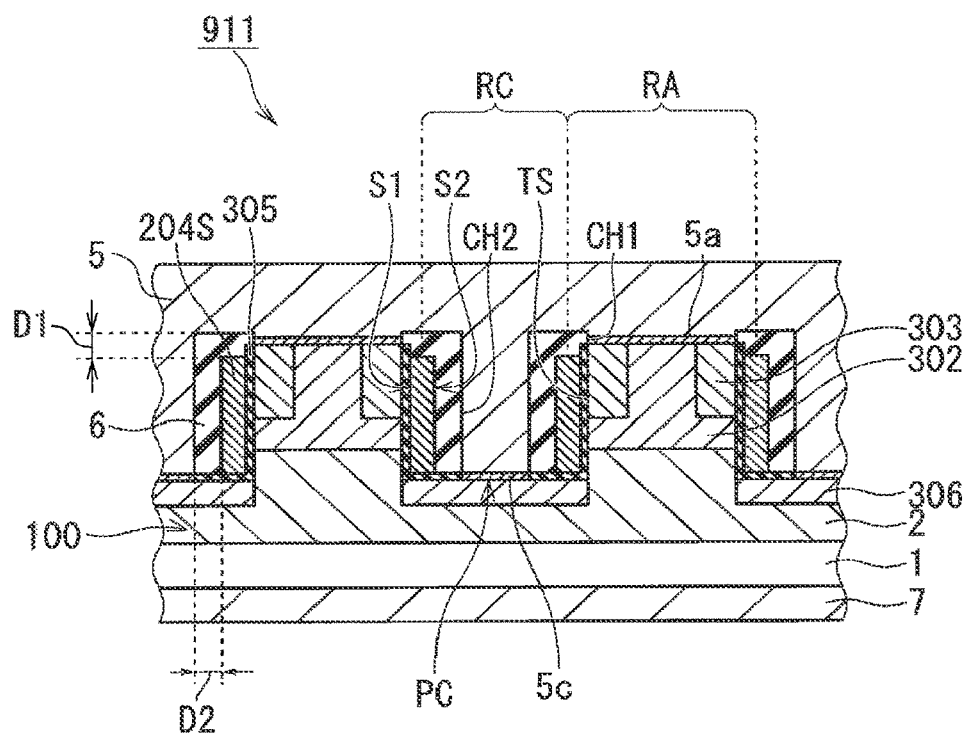
FIG. 21 is a partial sectional view schematically illustrating a structure of a semiconductor device according to Embodiment 4 of the present invention with a field of view along a thickness direction.

FIG. 21 is a partial sectional view schematically illustrating a structure of an MOSFET 911 (a semiconductor device) according to Embodiment 4. The field of view of FIG. 21 is the same as that of FIG. 1.

The MOSFET 911 differs from the MOSFET 901 (FIG. 1) in the structure of the interlayer oxide film 6. Specifically, the interlayer oxide film 6 of the MOSFET 911 is formed only in the striped trenches TS. Thus, the interlayer oxide film 6 is not formed on the epitaxial layer 100 outside the striped trenches TS. Unlike Embodiment 1, the interlayer oxide film 6 is not formed on the source regions 303 in Embodiment 4.

The upper surface of the striped gate electrode 204S is lower in level than the upper surface of the source region 303 in the MOSFET 911. In other words, the upper surface of the striped gate electrode 204S is separated downward from that of the source region 303. The upper surface of the striped gate electrode 204S is preferably higher in level than the lower surface of the source region 303. Such a positional relationship is stably obtained by disposing the lower surface of the source region 303 deeper than that in Embodiment 1.

Since the structure other than the described structure is the same as that according to Embodiment 1, the same reference numerals are assigned to the same or corresponding elements and the description thereof will not be repeated.

According to Embodiment 4, the width (a dimension in the horizontal direction in FIG. 21) of the striped active regions RA can be reduced. Thus, the density of channels to be formed in the MOSFET 911 is higher than that in the MOSFET 901. Consequently, the ON resistance of the MOSFET can be reduced. This will be described hereinafter in detail.

The upper surface of the striped gate electrode 204S is closer to the upper surface of the source region 303 in the MOSFET 901 (FIG. 1) according to Embodiment 1. Thus, the interlayer oxide film 6 is disposed on the upper surface of the source region 303 so that the striped gate electrode 204S is not short-circuited with the first contact hole CH1. In other words, the striped gate electrodes 204S are separated from the first contact holes CH1 in a plane direction (the horizontal direction in FIG. 1). Thus, the width of the striped active region RA includes not only the width of the first contact hole CH1 and halves of the width of the striped gate electrode 204S but also the width of a portion of the source region 303 on which the interlayer oxide film 6 is disposed. Thus, the width of the striped active region RA increases. Since misalignment of the mask in forming the first contact holes CH1 needs to be considered, the dimensional tolerance is required according to the ability of an exposure machine. This dimensional tolerance needs to be added to the width of the striped active region RA. The width of the striped active region RA in the MOSFET 901 is determined by these elements.

The first contact hole CH1 and the second contact hole CH2 differ in depth by the depth of the striped trench TS. Although depending on the dimensional design, the simultaneous exposure processes in photolithography for forming these contact holes are difficult. Thus, when the MOSFET 901 according to Embodiment 1 is manufactured, a process of forming the first contact holes CH1 needs to be separated from a process of forming the second contact holes CH2.

In the MOSFET 911 according to Embodiment 4, the upper surface of the striped gate electrode 204S is depressed by forming the source region 303 deeper, and the interlayer oxide film 6 is inserted inside the striped trenches TS. Consequently, the striped gate electrodes 204S are separated from the first contact holes CH1 in a direction perpendicular to the substrate 1. Here, the width of the striped active region RA is a sum of the width of the first contact hole CH1 and halves of the width of the striped gate electrode 204S. Thus, the width of the striped active regions RA in the MOSFET 911 is smaller than that of the MOSFET 901 (FIG. 1) by the width of the portion of the source region 303 on which the interlayer oxide film 6 is disposed. Consequently, the density of the striped active regions RA in the plane, that is, the channel density increases. Thus, the ON resistance of the MOSFET can be reduced.

The striped gate electrodes 204S and the interlayer oxide film 6 of the MOSFET 911 may be formed by forming a polysilicon layer and oxidizing a part of the polysilicon layer. The non-oxidized portion is used as the striped gate electrodes 204S, and the oxidized portion is used as the interlayer oxide film 6. Consequently, the width of the striped active regions RA can be further reduced, and the manufacturing processes can be simplified. Here, a method for manufacturing the MOSFET 911 will be hereinafter described.

Figure 22:
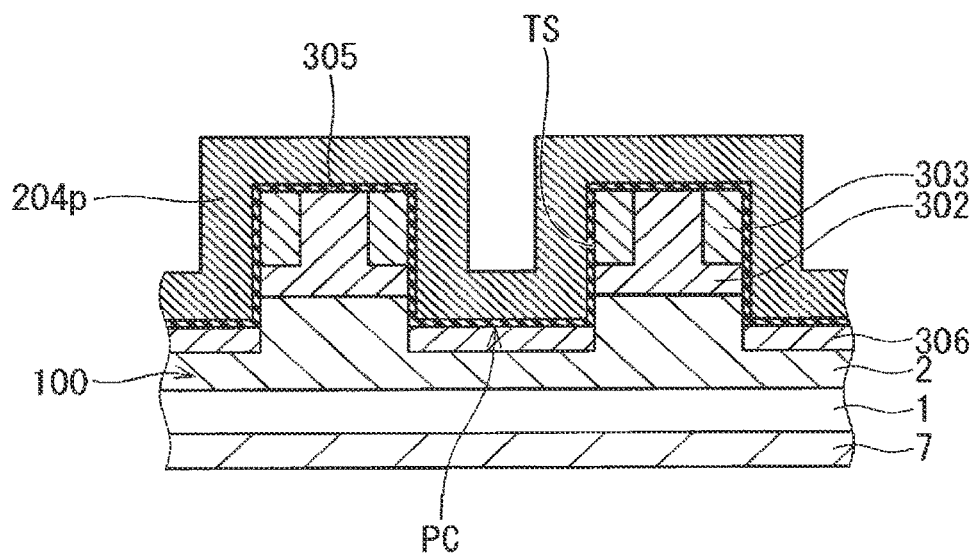
FIG. 22 is a partial sectional view schematically illustrating a process of a method for manufacturing the semiconductor device of FIG. 21.

With reference to FIG. 22, the processes illustrated in FIGS. 10 to 13, removal of the implantation mask 12, activation annealing, and formation of the gate oxide film 305 are performed similarly as according to Embodiment 1. Next, a polysilicon layer 204p is formed on the gate oxide film 305.

Figure 23:
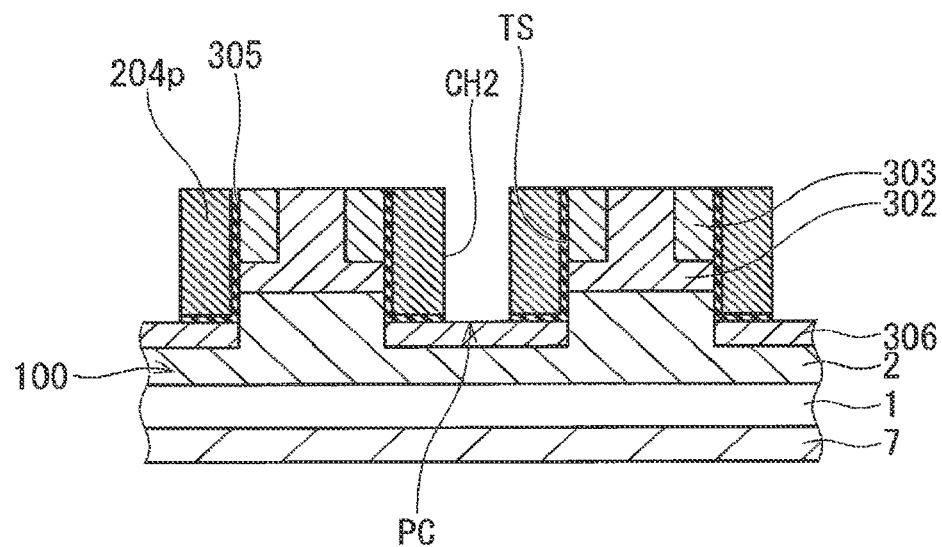
FIG. 23 is a partial sectional view schematically illustrating a process of the method for manufacturing the semiconductor device of FIG. 21.

With reference to FIG. 23, the first contact holes CH1 and the second contact holes CH2 are formed in the polysilicon layer 204p. Unlike Embodiment 1, the entire upper surface of the source region 303 may be exposed via the first contact hole CH1 in Embodiment 4. Thus, the first contact holes CH1 and the second contact holes CH2 may be formed by etch back without using any corresponding etching mask. Consequently, the process of forming the first contact holes CH1 can be performed simultaneously with the process of forming the second contact holes CH2 unlike Embodiment 1.

Figure 24:
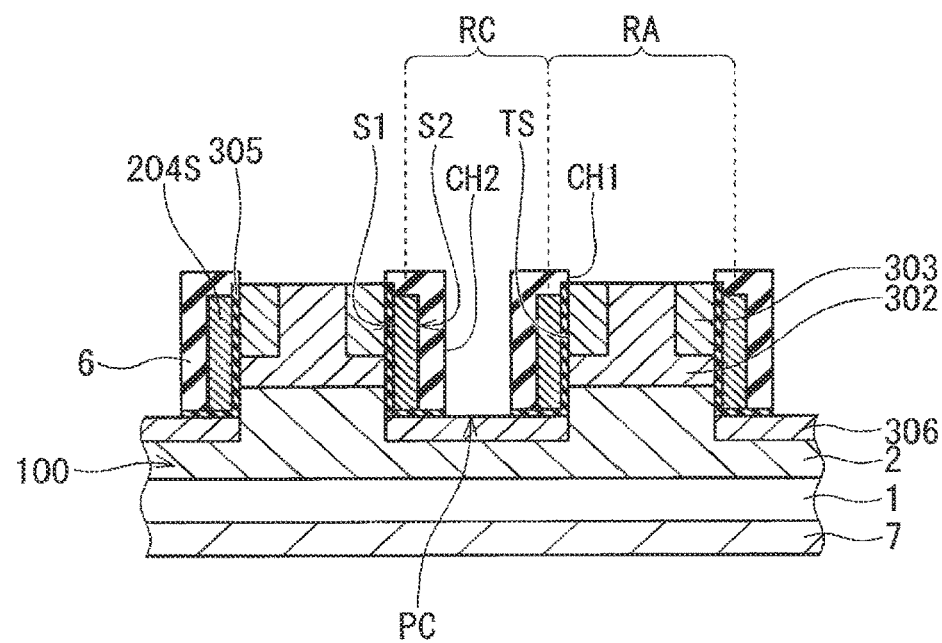
FIG. 24 is a partial sectional view schematically illustrating a process of the method for manufacturing the semiconductor device of FIG. 21.

With further reference to FIG. 24, the polysilicon layers 204p are partially oxidized through thermal oxidation. In other words, the surface side of the polysilicon layers 204p is oxidized. In the polysilicon layers 204p (FIG. 23), the non-oxidized portion becomes the striped gate electrodes 204S, and the oxidized portion becomes the interlayer oxide film 6. Here, the interlayer oxide film 6 is formed at least thicker than the gate oxide film 305, and preferably thicker than or equal to 100 nm. This is because if the interlayer oxide film 6 is excessively thin, an excessive increase in the gate-source capacitance may reduce the switching speed.

Then, almost the same processes as those according to Embodiment 1 are performed to obtain the MOSFET 911 (FIG. 21).

Since these manufacturing processes eliminate the need for considering exposure misalignment of the first contact holes CH1, the width of the striped active region RA is a sum of halves of the width of the striped gate electrode 204S, the width of the upper surface of the source regions 303, and the width of the upper surface of the base region 302. Thus, the width of the striped active region RA is substantially reduced more than that according to Embodiment 1 (FIG. 1). The width of the striped contact region RC can also be reduced in the described manufacturing method. Since the second contact holes CH2 are formed in self-alignment, there is no need to consider misalignment of the mask in exposure. Moreover, since the first contact holes CH1 and the second contact holes CH2 can be simultaneously formed, the manufacturing cost can be reduced through reduction in the number of processes. Thus, the manufacturing cost as well as the ON resistance can be reduced.

The modifications identical to those of Embodiment 1 are applicable to Embodiment 4.

Embodiments can be freely combined, and appropriately modified or omitted within the scope of the present invention. Although this invention has been described in detail, the description is in all aspects illustrative and does not restrict the invention. Thus, numerous modifications that have yet been exemplified will be devised without departing from the scope of the invention.

EXPLANATION OF REFERENCE SIGNS

R1 first row, R2 second row, S1 first side surface, S2 second side surface, CH1 first contact hole, CH2 second contact hole, PC protective-diffusion-layer grounding region, RA striped active region, RC striped contact region, RD striped dummy region, TC intersecting trench, TM intermediate trench, TS striped trench, 1 substrate, 2 drift layer, 5 source electrode, 5a, 5c ohmic electrode portion, 6 interlayer oxide film (interlayer insulation film), 7 drain electrode, 10 silicon oxide film, 11 etching mask, 12 implantation mask, 100 epitaxial layer, 204C intersecting gate electrode, 204M intermediate gate electrode, 204p polysilicon layer, 204S striped gate electrode, 206 dummy region, 207 supporting region, 302 base region, 303 source region, 305 gate oxide film (gate insulating film), 306, 306P protective diffusion layer, 306a first portion, 306b second portion, 901 to 911 MOSFET (semiconductor device).

The invention claimed is:

1. A semiconductor device, comprising:
a drift layer of a first conductivity type;
a base region of a second conductivity type formed on the drift layer;
a source region of the first conductivity type formed on the base region, the source region being separated from the drift layer by the base region;
a plurality of striped trenches each having, in a cross-sectional view, a pair of sidewalls penetrating the source region and the base region to reach the drift layer, the plurality of striped trenches extending in stripes in a plan view;
a protective diffusion layer of the second conductivity type formed at a bottom of each of the striped trenches, the protective diffusion layer being in contact with the drift layer;
a first gate insulating film formed adjacent to the pairs of the sidewalls of the striped trenches to cover the base region and the source region;
striped gate electrodes each having a first side surface, a second side surface, and an upper surface in each of the striped trenches, the first side surface being adjacent to the base region through the first gate insulating film, the second side surface being opposite to the first side surface, and the upper surface connecting the first side surface to the second side surface;
an interlayer insulation film covering the second side surfaces and the upper surfaces of the striped gate electrodes with a thickness larger than a thickness of the first gate insulating film, the interlayer insulation film including first contact holes connected to the source region and the base region outside each of the striped trenches, and second contact holes connected to the protective diffusion layer inside the striped trenches; and
a source electrode connected to the source region, the base region, and the protective diffusion layer, the source electrode being in ohmic contact with the protective diffusion layer,
wherein in the plan view, a plurality of striped active regions and a plurality of striped contact regions both extending in a longitudinal direction exist, the striped contact regions are respectively connected to regions of the protective diffusion layer, and a striped pattern is provided by alternately and repeatedly disposing the striped active regions and the striped contact regions in a direction perpendicular to the longitudinal direction, the striped active regions and the striped contact regions being partitioned by the striped gate electrodes, the source electrode is connected to the source region and the base region through the first contact holes of the interlayer insulation film in each of the striped active regions, and each of the striped gate electrodes forms a switchable channel with the first side surface being adjacent to the base region through the first gate insulating film in a corresponding one of the striped trenches, the source electrode is connected to the protective diffusion layer through the second contact holes of the interlayer insulation film in each of the striped contact regions, the second contact holes being formed in stripes, and the semiconductor device further comprises:

an intersecting trench extending in a direction transverse to the longitudinal direction in each of the striped active regions and having, in the cross-sectional view, a pair of sidewalls penetrating the source region and the base region to reach the drift layer; and an intersecting gate electrode formed in the intersecting trench through a second gate insulating film, the striped gate electrodes extend continuously in the longitudinal direction, and the intersecting gate electrode mutually connects two adjacent portions of the striped gate electrodes in the direction perpendicular to the longitudinal direction, the two adjacent portions sandwiching at least one of the striped active regions.

2. The semiconductor device according to claim 1, further comprising supporting regions which protrude from the bottom of the striped trenches and away from the source electrode between the striped active regions and the striped contact regions, the supporting regions each having a pair of side surfaces that are opposite to each other, wherein the striped gate electrodes have portions adjacent to the pairs of the side surfaces of the supporting regions.

3. The semiconductor device according to claim 2, wherein the supporting regions are disposed on the protective diffusion layers.

4. The semiconductor device according to claim 1, further comprising:

intermediate trenches formed between two adjacent ones of the plurality of striped trenches and penetrating the source region and the base region to reach the drift layer; and an intermediate gate electrode adjacent to the base region through a third gate insulating film in each of the intermediate trenches.

5. The semiconductor device according to claim 4, wherein the intermediate trenches are shallower than the striped trenches, and the protective diffusion layer is not disposed at a bottom of the intermediate trenches.

6. The semiconductor device according to claim 4, wherein the intermediate trenches are shallower than the striped trenches, and the protective diffusion layers include a first portion disposed at the bottom of each of the striped trenches, and a second portion disposed at a bottom of each of the intermediate trenches, the second portion being lower in impurity concentration than the first portion.

7. The semiconductor device according to claim 1, wherein, in the plan view, the interlayer insulation film is formed not on the source region but in the striped trenches.

8. The semiconductor device according to claim 1, wherein the protective diffusion layer is higher in impurity concentration of the second conductivity type than the base region.

9. The semiconductor device according to claim 1, further comprising a dummy region that protrudes from the bottom of each of the striped trenches and away from the source electrode in each of the striped contact regions, wherein each of the striped gate electrodes has a portion adjacent to a side surface of the dummy region, the side surface mutually connecting two adjacent portions of the striped gate electrode in the direction perpendicular to the longitudinal direction, the two adjacent portions sandwiching one of the striped contact regions.

10. The semiconductor device according to claim 1, wherein the drift layer is made of a wide-bandgap semiconductor.

11. A semiconductor device, comprising:

a drift layer of a first conductivity type;

a base region of a second conductivity type formed on the drift layer;

a source region of the first conductivity type formed on the base region, the source region being separated from the drift layer by the base region;

a plurality of striped trenches each having, in a cross-sectional view, a pair of sidewalls penetrating the source region and the base region to reach the drift layer, the plurality of striped trenches extending in stripes in a plan view;

a protective diffusion layer of the second conductivity type formed at a bottom of each of the striped trenches, the protective diffusion layer being in contact with the drift layer;

a gate insulating film formed adjacent to the pairs of the sidewalls of the striped trenches to cover the base region and the source region;

striped gate electrodes each having a first side surface, a second side surface, and an upper surface in each of the striped trenches, the first side surface being adjacent to the base region through the gate insulating film, the second side surface being opposite to the first side surface, and the upper surface connecting the first side surface to the second side surface;

an interlayer insulation film covering the second side surfaces and the upper surfaces of the striped gate electrodes with a thickness larger than a thickness of the gate insulating film, the interlayer insulation film including first contact holes connected to the source region and the base region outside each of the striped trenches, and second contact holes connected to the protective diffusion layer inside the striped trenches; and a source electrode connected to the source region, the base region, and the protective diffusion layer, the source electrode being in ohmic contact with the protective diffusion layer, wherein in the plan view, a plurality of striped active regions and a plurality of striped contact regions both extending in a longitudinal direction exist, the striped contact regions are respectively connected to regions of the protective diffusion layer, and a striped pattern is provided by alternately and repeatedly disposing the striped active regions and the striped contact regions in a direction perpendicular to the longitudinal direction, the striped active regions and the striped contact regions being partitioned by the striped gate electrodes, the source electrode is connected to the source region and the base region through the first contact holes of the interlayer insulation film in each of the striped active regions, and each of the striped gate electrodes forms a switchable channel with the first side surface being adjacent to the base region through the gate insulating film in a corresponding one of the striped trenches, the source electrode is connected to the protective diffusion layer through the second contact holes of the interlayer insulation film in each of the striped contact regions, a first row and a second row in each of which the striped active regions and the striped contact regions are alternately and repeatedly disposed exist, the striped active regions in the first row are facing the striped contact regions in the second row in the longitudinal direction, and the striped contact regions in the first row are facing the striped active regions in the second row in the longitudinal direction.

12. The semiconductor device according to claim 11, wherein, in the plan view, the interlayer insulation film is formed not on the source region but in the striped trenches.

13. The semiconductor device according to claim 11, wherein the protective diffusion layer is higher in impurity concentration of the second conductivity type than the base region.

14. The semiconductor device according to claim 11, further comprising
a dummy region that protrudes from the bottom of each of the striped trenches and away from the source electrode in each of the striped contact regions,
wherein each of the striped gate electrodes has a portion adjacent to a side surface of the dummy region, the side surface mutually connecting two adjacent portions of the striped gate electrode in the direction perpendicular to the longitudinal direction, the two adjacent portions sandwiching one of the striped contact regions.

15. The semiconductor device according to claim 11, wherein the drift layer is made of a wide-bandgap semiconductor.

16. The semiconductor device according to claim 11, comprising the protective diffusion layer extending continuously from one of the striped gate electrodes to the other of the striped gate electrodes in each of the trenches.

* * * * *